US012615942B2

(12) United States Patent
Lee et al.

(10) Patent No.: US 12,615,942 B2
(45) Date of Patent: Apr. 28, 2026

(54) DISPLAY PANEL

(71) Applicant: Samsung Display Co., Ltd., Yongin-si (KR)

(72) Inventors: Seongyeon Lee, Asan-si (KR); Jang-Il Kim, Asan-si (KR); Jeongki Kim, Hwaseong-si (KR); Jong-Hoon Kim, Seoul (KR); Kyounghae Min, Asan-si (KR); Hyejun Woo, Asan-si (KR); Hakbum Choi, Cheonan-si (KR); Seok-Joon Hong, Seongnam-si (KR); Tae Hyung Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 559 days.

(21) Appl. No.: 18/109,078

(22) Filed: Feb. 13, 2023

(65) Prior Publication Data

US 2023/0263031 A1 Aug. 17, 2023

(30) Foreign Application Priority Data

Feb. 17, 2022 (KR) ........................ 10-2022-0020828

(51) Int. Cl.
H10K 59/38 (2023.01)
H10K 59/80 (2023.01)

(52) U.S. Cl.
CPC ........... H10K 59/38 (2023.02); H10K 59/879 (2023.02)

(58) Field of Classification Search
CPC ............................ H10K 59/38; H10K 59/879
See application file for complete search history.

(56) References Cited

U.S. PATENT DOCUMENTS

| | | | |
|---|---|---|---|
| 10,739,502 B2 | 8/2020 | Baek et al. | |
| 11,041,981 B2 | 6/2021 | Jung et al. | |
| 11,362,309 B2 | 6/2022 | Chung et al. | |
| 2014/0368766 A1* | 12/2014 | Shibata | G02B 5/285 |
| | | | 349/61 |
| 2020/0033670 A1* | 1/2020 | Lee | G02F 1/0063 |
| 2021/0126056 A1 | 4/2021 | Kim et al. | |

FOREIGN PATENT DOCUMENTS

| | | |
|---|---|---|
| KR | 10-2009-0046100 | 5/2009 |
| KR | 10-2018-0026601 | 3/2018 |
| KR | 10-2018-0064616 | 6/2018 |
| KR | 10-2019-0047592 A | 5/2019 |
| KR | 10-2021-0052618 A | 6/2019 |
| KR | 10-2020-0086413 A | 7/2020 |
| KR | 10-2020-0096384 | 8/2020 |
| KR | 10-2019-0063618 A | 5/2021 |

* cited by examiner

*Primary Examiner* — Anne M Hines
(74) *Attorney, Agent, or Firm* — Womble Bond Dickinson (US) LLP

(57) ABSTRACT

A display panel includes a light emitting element layer including a light emitting element that generates a first color light, a light control layer over the light emitting element layer, a color filter layer over the light control layer, and a low refractive index layer that is between the light control layer and the color filter layer and that has a thickness of about 0.2 μm to about 2.5 μm.

20 Claims, 15 Drawing Sheets

NDA

PXmn

DLn

PD

GL1

GLm

PX11

DL1

GDC

DR1
DR2
DR3

DISPLAY PANEL

CROSS-REFERENCE TO RELATED APPLICATIONS

This application claims priority to and the benefit of Korean Patent Application No. 10-2022-0020828 filed on Feb. 17, 2022, in the Korean Intellectual Property Office, the disclosure of which is incorporated by reference herein in its entirety.

BACKGROUND

1. Field

Embodiments of the present disclosure described herein relate to a display panel, and for example, relate to a display panel having improved display efficiency.

2. Description of the Related Art

A display panel includes a transmissive display panel that selectively transmits source light generated from a light source and an emissive display panel that generates source light by itself. The display panel may include different types (e.g., kinds) of light control patterns depending on pixels to generate a color image. The light control patterns may transmit only a partial wavelength range of source light, or may convert the color of the source light. Some of the light control patterns may change characteristics of the light without changing the color of the source light.

SUMMARY

Aspects of embodiments are directed toward a display panel having improved display efficiency.

Aspects of embodiments of the present disclosure are directed toward a display panel for enhancing or optimally setting the thickness of a low refractive index layer within a range satisfying display efficiency and a process limit.

Aspects of embodiments of the present disclosure provide a display panel for increasing recycling efficiency of source light and display efficiency by allowing a low refractive index layer to have different thicknesses in respective pixel areas.

Additional aspects will be set forth in part in the description which follows and, in part, will be apparent from the description, or may be learned by practice of the presented embodiments of the disclosure.

According to an embodiment, a display panel includes a light emitting element layer including a light emitting element that generates first color light, a light control layer disposed over the light emitting element layer, a color filter layer disposed over the light control layer, and a low refractive index layer that is disposed between the light control layer and the color filter layer and that has a thickness of 0.2 μm to 2.5 μm.

The low refractive index layer may have a thickness of 0.4 μm to 2.5 μm.

The light control layer may include a first light control pattern that converts the first color light into second color light, a second light control pattern that converts the first color light into third color light, and a third light control pattern that transmits the first color light, and the first light control pattern and the second light control pattern may contain a quantum dot.

The color filter layer may include a first color filter corresponding to the first light control pattern, a second color filter corresponding to the second light control pattern, and a third color filter corresponding to the third light control pattern, and the low refractive index layer may include a first low refractive index pattern corresponding to the first color filter, a second low refractive index pattern corresponding to the second color filter, and a third low refractive index pattern corresponding to the third color filter.

The first low refractive index pattern, the second low refractive index pattern, and the third low refractive index pattern may have different thicknesses.

The first color filter, the second color filter, and the third color filter may have different thicknesses.

The thicknesses of the first low refractive index pattern, the second low refractive index pattern, and the third low refractive index pattern may be inversely proportional to the thicknesses of the first color filter, the second color filter, and the third color filter respectively.

A first pixel area in which the first light control pattern is disposed, a second pixel area in which the second light control pattern is disposed, and a third pixel area in which the third light control pattern is disposed may be defined, and the first pixel area, the second pixel area, and the third pixel area may have different areas on a plane.

The thicknesses of the first low refractive index pattern, the second low refractive index pattern, and the third low refractive index pattern may be inversely proportional to the areas of the first pixel area, the second pixel area, and the third pixel area respectively.

The low refractive index layer may include a first low refractive index pattern corresponding to the first light control pattern, a second low refractive index pattern corresponding to the second light control pattern, and a third low refractive index pattern corresponding to the third light control pattern, and the third low refractive index pattern may have a smaller thickness than each of the first low refractive index pattern and the second low refractive index pattern.

The display panel may further include a capping layer that is disposed between the light control layer and the low refractive index layer and that provides a flat surface (e.g., a planar surface) to the light control layer.

According to an embodiment, a display panel includes a light emitting element layer including a light emitting element that emits first color light, a light control layer disposed over the light emitting element layer, a color filter layer that is disposed over the light control layer and that includes a first color filter, a second color filter, and a third color filter having different thicknesses, and a low refractive index layer that is disposed between the light control layer and the color filter layer and that includes a first low refractive index pattern corresponding to the first color filter, a second low refractive index pattern corresponding to the second color filter, and a third low refractive index pattern corresponding to the third color filter, and the first low refractive index pattern, the second low refractive index pattern, and the third low refractive index pattern have different thicknesses.

The low refractive index layer may have a thickness of 0.2 μm to 2.5 μm.

The light control layer may include a first light control pattern, a second light control pattern, and a third light control pattern. The first light control pattern may correspond to the first low refractive index pattern, the second light control pattern may correspond to the second low refractive index pattern, and the third light control pattern may correspond to the third low refractive index pattern.

At least one light control pattern among (i.e., selected from among) the first light control pattern, the second light control pattern, and the third light control pattern may contain a quantum dot, and the remaining light control pattern(s) may not contain any quantum dot.

The at least one light control pattern containing the quantum dot may have a thickness of 0.4 μm or more.

The remaining light control pattern(s) not containing any quantum dot may have a smaller thickness than the at least one light control pattern containing the quantum dot.

The thicknesses of the first color filter, the second color filter, and the third color filter may be inversely proportional to the thicknesses of the first low refractive index pattern, the second low refractive index pattern, and the third low refractive index pattern respectively.

A first pixel area in which the first light control pattern is disposed, a second pixel area in which the second light control pattern is disposed, and a third pixel area in which the third light control pattern is disposed may be defined, and areas of the first pixel area, the second pixel area, and the third pixel area may be inversely proportional to the thicknesses of the first low refractive index pattern, the second low refractive index pattern, and the third low refractive index pattern corresponding to the first pixel area, the second pixel area, and the third pixel area, respectively.

The display panel may further include a capping layer that is disposed between the light control layer and the low refractive index layer and that covers the low refractive index layer and contains an inorganic material.

BRIEF DESCRIPTION OF THE DRAWINGS

The above and other objects and features of the present disclosure will become apparent by describing in more detail embodiments thereof with reference to the accompanying drawings.

FIG. 1C is a plan view of the display panel according to an embodiment of the present disclosure.

DETAILED DESCRIPTION

Figure 1A:
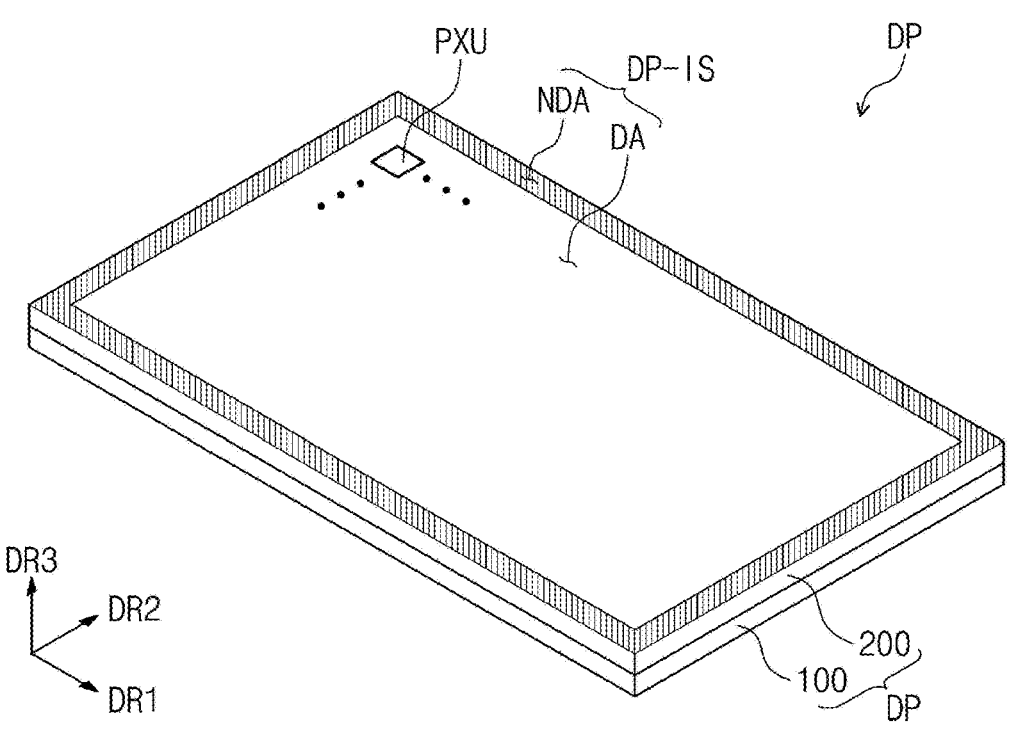
FIG. 1A is a perspective view of a display panel according to an embodiment of the present disclosure.

In this specification, when it is mentioned that a component (or, an area, a layer, a part, etc.) is referred to as being "on", "connected to" or "coupled to" another component, this refers to that the component may be directly on, connected to, or coupled to the other component or one or more third components may be present therebetween.

Identical reference numerals refer to identical components. Additionally, in the drawings, the thicknesses, proportions, and dimensions of components are exaggerated for effective description. As used herein, the term "and/or" includes all of one or more combinations defined by related components.

Terms such as first, second, and/or the like may be used to describe one or more suitable components, but the components should not be limited by the terms. The terms may be used only for distinguishing one component from other components. For example, without departing the scope of the present disclosure, a first component may be referred to as a second component, and similarly, the second component may also be referred to as the first component. The terms of a singular form may include plural forms unless otherwise specified.

In some embodiments, terms such as "below", "under", "above", and "over" are used to describe a relationship of components illustrated in the drawings. The terms are relative concepts and are described based on directions illustrated in the drawing.

It should be understood that terms such as "comprise", "include", and "have", when used herein, specify the presence of stated features, numbers, steps, operations, components, parts, or combinations thereof, but do not preclude the presence or addition of one or more other features, numbers, steps, operations, components, parts, or combinations thereof.

Unless otherwise defined, all terms used herein, including technical or scientific terms, have the same meanings as those generally understood by those skilled in the art to which the present disclosure pertains. Such terms as those defined in a generally used dictionary are to be interpreted as having meanings equal to the contextual meanings in the relevant field of art, and are not to be interpreted as having ideal or excessively formal meanings unless clearly defined as having such in the present application.

Hereinafter, embodiments of the present disclosure will be described with reference to the accompanying drawings.

Figure 1B:
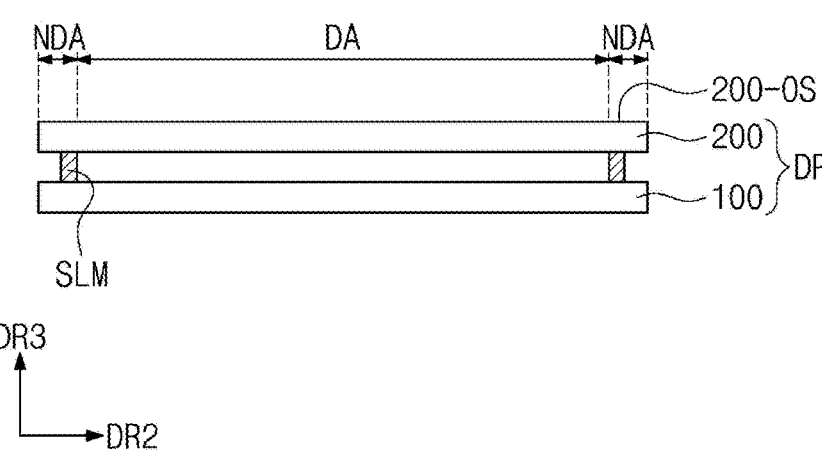
FIG. 1B is a sectional view of the display panel according to an embodiment of the present disclosure.

FIG. 1A is a perspective view of a display panel DP according to an embodiment of the present disclosure. FIG. 1B is a sectional view of the display panel DP according to an embodiment of the present disclosure.

Referring to FIGS. 1A and 1B, the display panel DP may be one selected from among a liquid crystal display panel, an electrophoretic display panel, a microelectromechanical system (MEMS) display panel, an electrowetting display panel, a quantum-dot light emitting display panel, and an organic light emitting display panel and is not particularly limited.

In some embodiment, the display panel DP may further include a chassis member or a molding member and may further include a backlight unit depending on the type or kind of the display panel DP.

The display panel DP may include a first display substrate 100 (or, a lower display substrate) and a second display substrate 200 (or, an upper display substrate) that faces the first display substrate 100 and that is spaced apart from the first display substrate 100. A set or predetermined cell gap may be formed between the first display substrate 100 and the second display substrate 200. The cell gap may be maintained by a sealant SLM that combines the first display substrate 100 and the second display substrate 200. The cell gap may be filled with an insulating material.

A gray-scale display layer for generation of an image may be disposed between a base substrate of the first display substrate 100 and a base substrate of the second display substrate 200. The gray-scale display layer may include a liquid crystal layer, an organic light emitting layer, an inorganic light emitting layer (e.g., a quantum-dot light emitting layer or an LED light emitting layer), or an electrophoretic layer depending on the type or kind of the display panel DP.

As illustrated in FIG. 1A, the display panel DP may display an image through a display surface DP-IS. The outer surface 200-OS of the second display substrate 200 illustrated in FIG. 1B may be defined as the display surface DP-IS of FIG. 1A.

The display surface DP-IS is parallel to a plane defined by a first directional axis DR1 and a second directional axis DR2. The display panel DP may include a display area DA and a non-display area NDA. Unit pixels PXU are disposed in the display area DA and are not disposed in the non-display area NDA. The non-display area NDA is defined along the periphery of the display surface DP-IS. The non-display area NDA may surround the display area DA. In an embodiment of the present disclosure, the non-display area NDA may not be provided, or may be disposed on only one side of the display area DA.

The unit pixels PXU illustrated in FIG. 1A may define pixel rows and pixel columns. Each of the unit pixels PXU may include at least one pixel as a minimum repeat unit. Each of the unit pixels PXU may include a plurality of pixels that provide light beams having different colors.

The normal direction of the display surface DP-IS, that is, the thickness direction of the display panel DP is indicated by a third directional axis DR3. Front surfaces (or, upper surfaces) and rear surfaces (or, lower surfaces) of layers or units to be described are distinguished from each other based on the third directional axis DR3. However, the first to third directional axes DR1, DR2, and DR3 illustrated in this embodiment are merely illustrative. Hereinafter, first to third directions are defined as directions indicated by the first to third directional axes DR1, DR2, and DR3, respectively, and will be assigned with the same reference numerals as the first to third directional axes DR1, DR2, and DR3.

Although the display panel DP including the planar display surface DP-IS is illustrated in the embodiment of the present disclosure, the present disclosure is not limited thereto. The display panel DP may include a curved display surface or a three-dimensional display surface. The three-dimensional display surface may include a plurality of display areas indicating different directions.

Figure 1C:
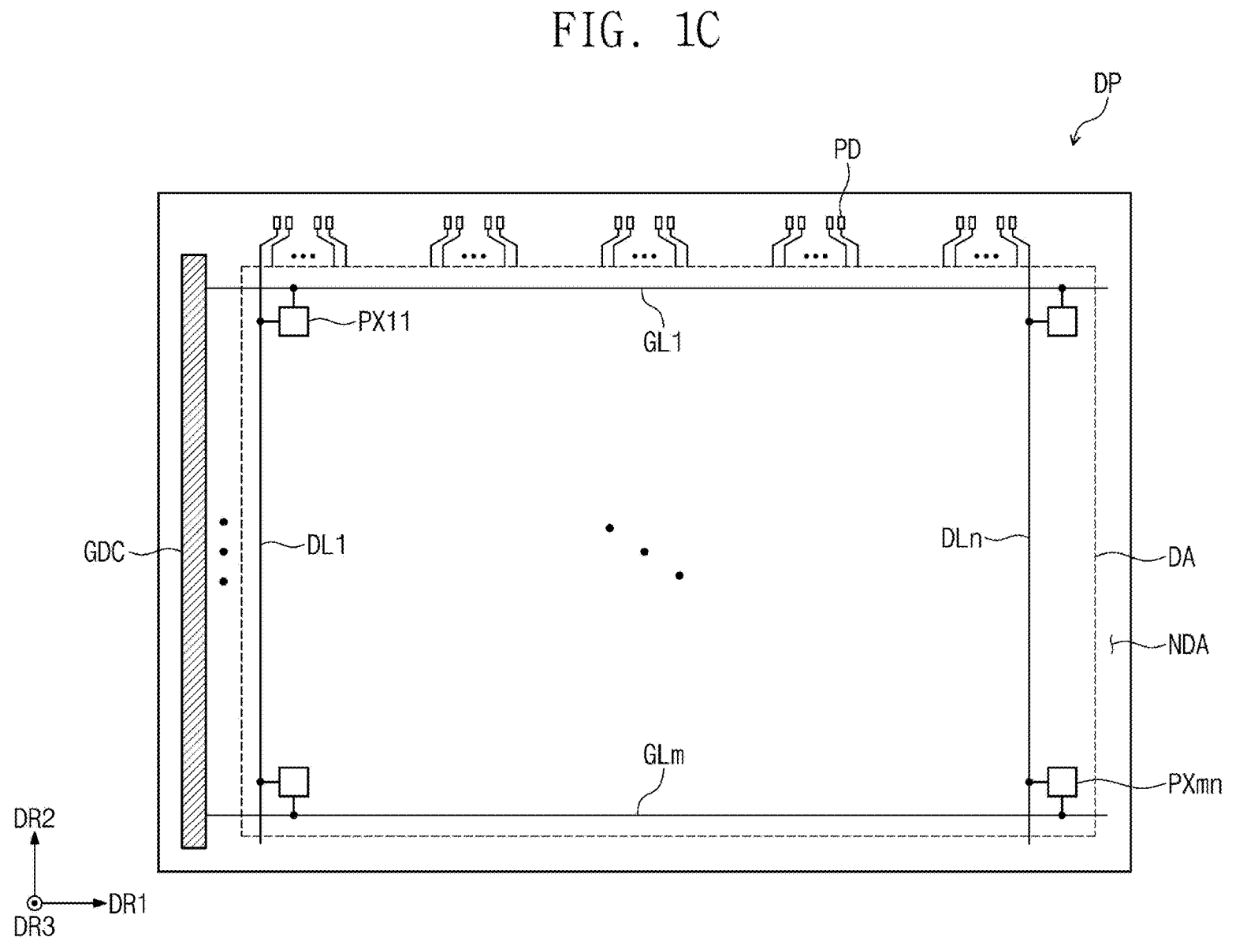
Figure 2:
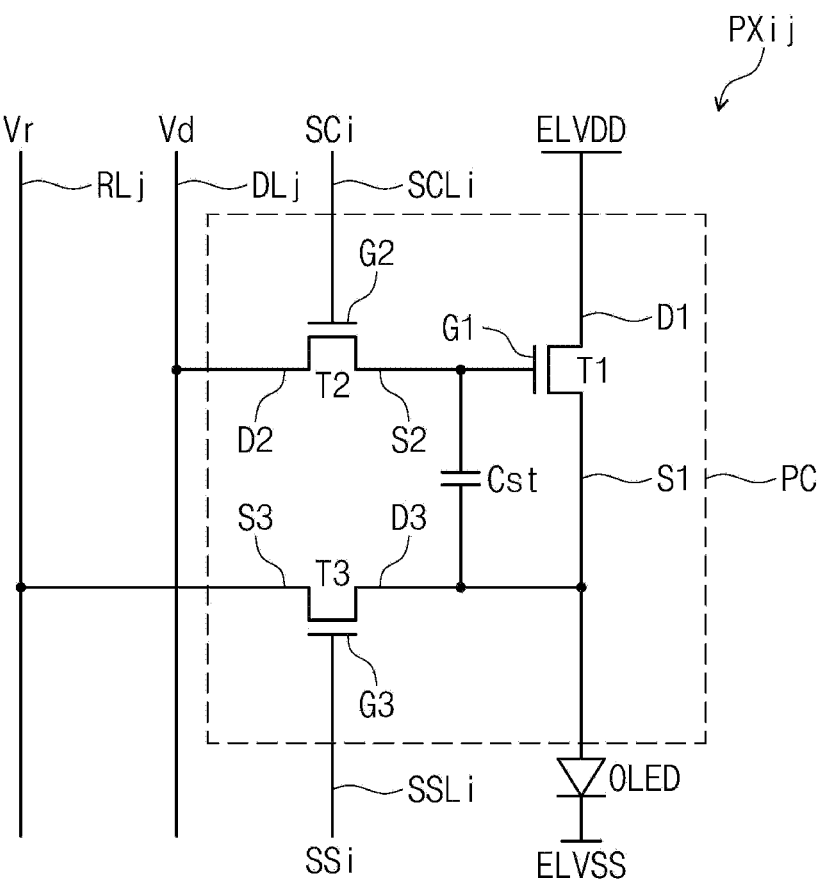
FIG. 2 is an equivalent circuit diagram of a pixel according to an embodiment of the present disclosure.

FIG. 1C is a plan view of the display panel DP according to an embodiment of the present disclosure. FIG. 2 is an equivalent circuit diagram of a pixel PXij according to an embodiment of the present disclosure.

FIG. 1C illustrates a planar arrangement relationship between signal lines GL1 to GLm and DL1 to DLn and pixels PX11 to PXmn included in the display panel DP. The signal lines GL1 to GLm and DL1 to DLn may include the plurality of scan lines GL1 to GLm and the plurality of data lines DL1 to DLn. Each of the plurality of data lines DL1 to DLn may be electrically connected to a corresponding pad PD. A plurality of pads PD may be provided.

Each of the pixels PX11 to PXmn is connected to a corresponding one of the plurality of scan lines GL1 to GLm and a corresponding one of the plurality of data lines DL1 to DLn. Each of the pixels PX11 to PXmn may include a pixel drive circuit and a light emitting element. More types (e.g., kinds) of signal lines may be included in the display panel DP depending on the configurations of the pixel drive circuits of the pixels PX11 to PXmn.

The pixels PX11 to PXmn are disposed in the display area DA, and a gate drive circuit GDC is disposed in the non-display area NDA. The pixels PX11 to PXmn are divided into groups, and the groups correspond to the unit pixels PXU described above with reference to FIG. 1A.

FIG. 2 illustrates the pixel PXij that is connected to the $i^{th}$ scan line SCLi, the $i^{th}$ sensing line SSLi, the $j^{th}$ data line DLj, and the $j^{th}$ reference line RLj. The pixel PXij includes a pixel circuit PC and a light emitting element OLED connected to the pixel circuit PC. The pixel circuit PC may include a plurality of transistors T1 to T3 and a capacitor Cst. The plurality of transistors T1 to T3 may be formed through a low-temperature polycrystalline silicon (LTPS) process or a low-temperature polycrystalline oxide (LTPO) process. Although it will be disclosed as examples that the plurality of transistors T1 to T3 are N-type or channel transistors, at least one of the transistors T1 to T3 may be implemented with a P-type or channel transistor.

In this embodiment, the pixel circuit PC that includes the first transistor T1 (or, the drive transistor), the second transistor T2 (or, the switch transistor), the third transistor T3 (or, the sensing transistor), and the capacitor Cst is illustrated. However, the pixel circuit PC is not limited thereto. The pixel circuit PC may further include an additional transistor, or may further include an additional capacitor.

The light emitting element OLED may be an organic light emitting element or an inorganic light emitting element that includes an anode (a first electrode) and a cathode (a second electrode). The anode of the light emitting element OLED may receive a first voltage ELVDD through the first transistor T1, and the cathode of the light emitting element OLED may receive a second voltage ELVSS. The light emitting element OLED may receive the first voltage ELVDD and the second voltage ELVSS and may emit light.

The first transistor T1 may include a drain D1 that receives the first voltage ELVDD, a source S1 connected to the anode of the light emitting element OLED, and a gate G1 connected to the capacitor Cst. The first transistor T1 may control a drive current flowing to the light emitting element OLED from a line the first voltage ELVDD is provided in response to a voltage value stored in the capacitor Cst.

The second transistor T2 may include a drain D2 connected to the $j^{th}$ data line DLj, a source S2 connected to the capacitor Cst, and a gate G2 that receives the $i^{th}$ first scan signal SCi. The $j^{th}$ data line DLj may receive a data voltage Vd. The second transistor T2 provides the data voltage Vd to the first transistor T1 in response to the $i^{th}$ first scan signal SCi.

The third transistor T3 may include a source S3 connected to the $j^{th}$ reference line RLj, a drain D3 connected to the anode of the light emitting element OLED, and a gate G3 that receives the $i^{th}$ second scan signal SSi. The $j^{th}$ reference line RLj may receive a reference voltage Vr. The third transistor T3 may initialize the capacitor Cst and the anode of the light emitting element OLED.

The capacitor Cst stores a voltage corresponding to a difference between a voltage received from the second transistor T2 and the first voltage ELVDD. The capacitor Cst may be connected to the gate G1 of the first transistor T1 and the anode of the light emitting element OLED.

Figure 3A:
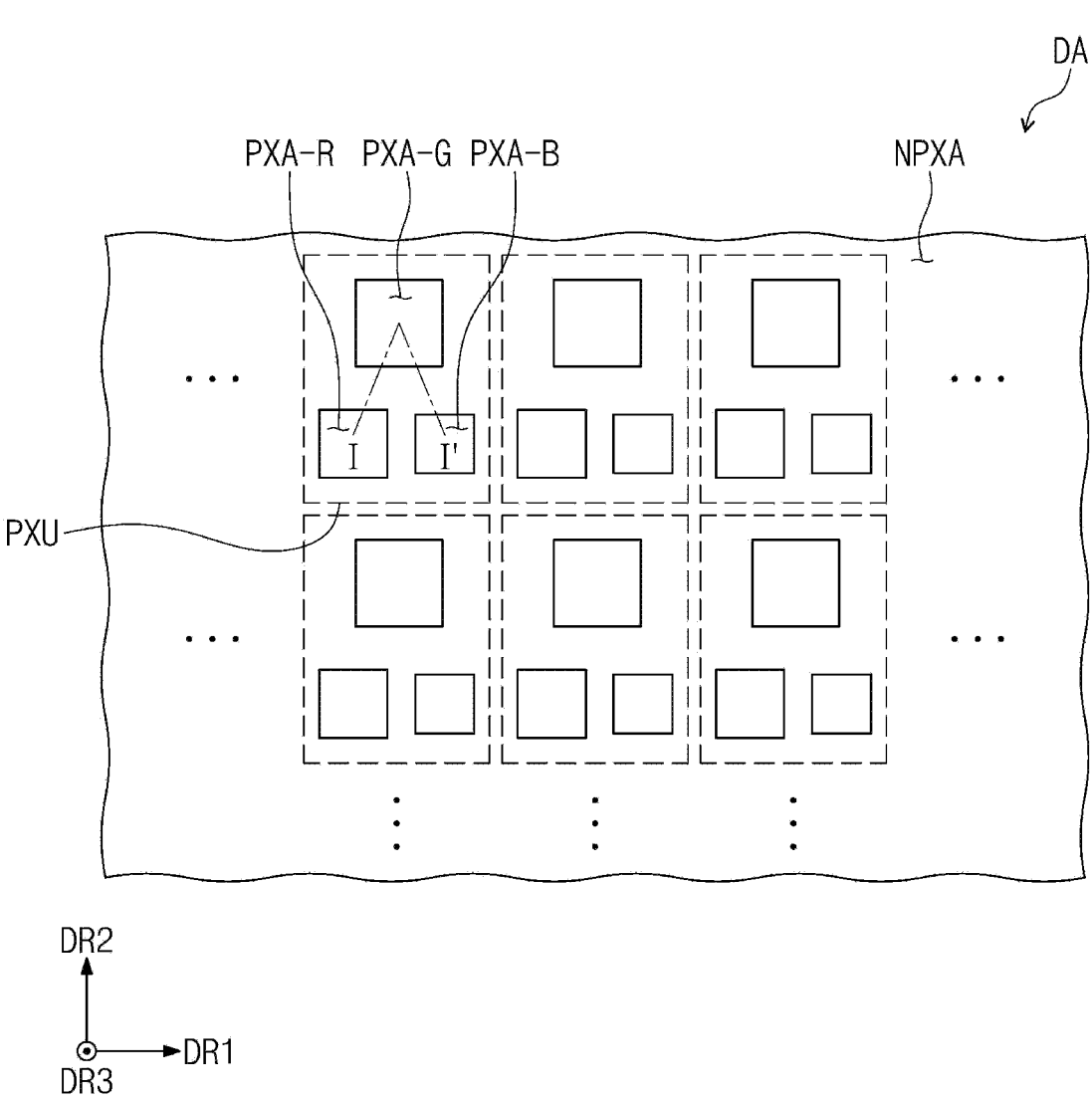
FIG. 3A is an enlarged plan view of a display area according to an embodiment of the present disclosure.
Figure 3B:
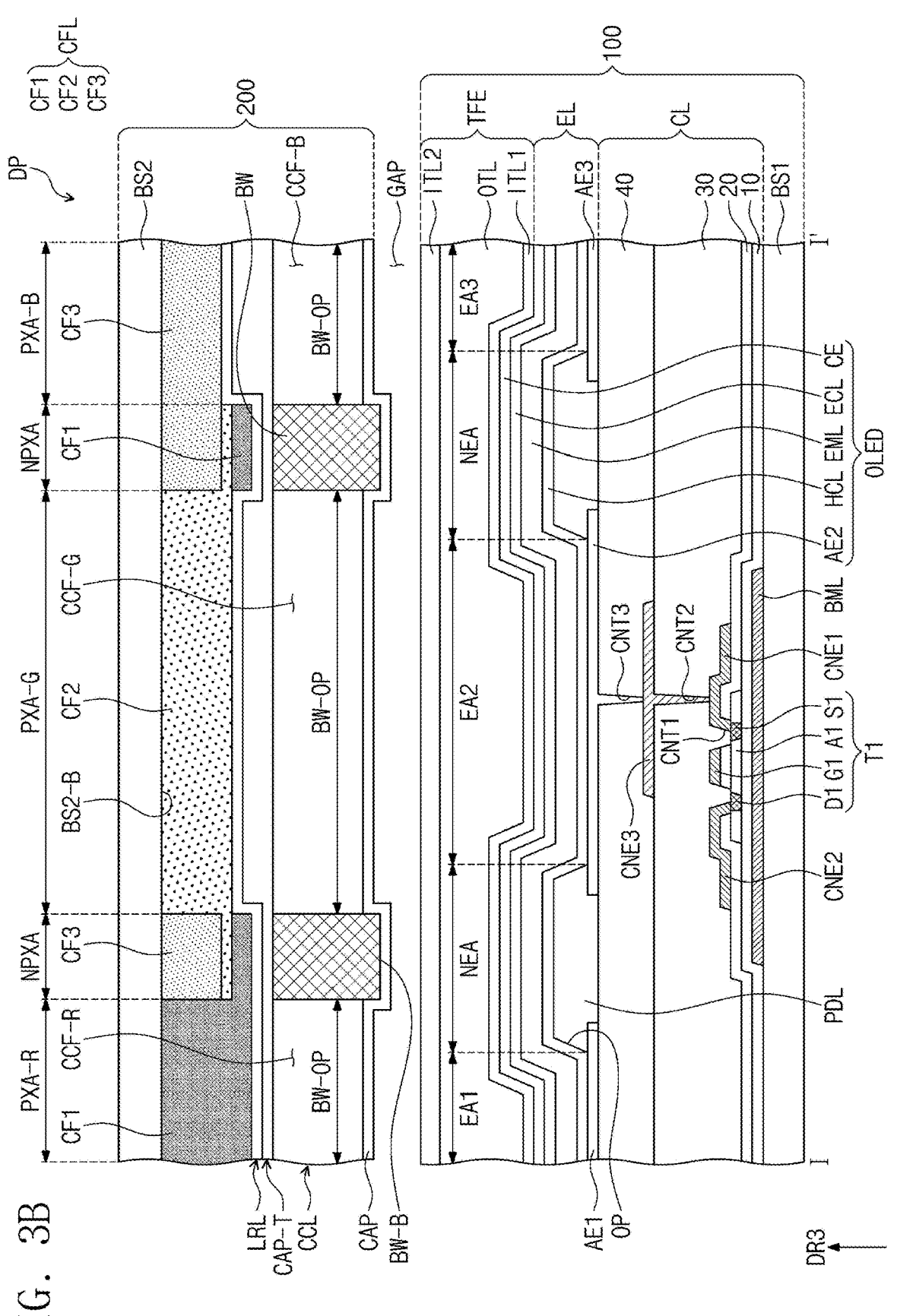
FIG. 3B is a sectional view illustrating the display area of the display panel according to an embodiment of the present disclosure.

FIG. 3A is an enlarged plan view of the display area according to an embodiment of the present disclosure. FIG. 3B is a sectional view of the display area according to an embodiment of the present disclosure.

As illustrated in FIG. 3A, the unit pixels PXU are arranged in the first direction DR1 and the second direction DR2. In this embodiment, each of the unit pixels PXU may include a first pixel, a second pixel, and a third pixel that emit light beams having different colors. The first pixel, the second pixel, and the third pixel may generate red light, green light, and blue light, respectively. In FIG. 3A, a first pixel area PXA-R, a second pixel area PXA-G, and a third pixel area PXA-B are illustrated on behalf of the first pixel, the second pixel, and the third pixel, respectively. A peripheral area NPXA is disposed between the first pixel area PXA-R, the second pixel area PXA-G, and the third pixel area PXA-B. The peripheral area NPXA sets the borders between the first to third pixel areas PXA-R, PXA-G, and PXA-B and prevents or reduces color mixing between the first to third pixel areas PXA-R, PXA-G, and PXA-B.

Referring to FIG. 3A, the first pixel area PXA-R and the third pixel area PXA-B are disposed in the same row, and the second pixel area PXA-G is disposed in a row different from the row in which the first pixel area PXA-R and the third pixel area PXA-B are disposed. The second pixel area PXA-G may have the largest area, and the third pixel area PXA-B may have the smallest area. However, the present disclosure is not limited thereto. In this embodiment, the first pixel area PXA-R, the second pixel area PXA-G, and the third pixel area PXA-B that have a substantially square shape are illustrated. However, the present disclosure is not limited thereto.

FIG. 3B is a sectional view taken along line I-I' of FIG. 3A.

FIG. 3B focuses on a section corresponding to the second pixel area PXA-G and illustrates a section of a first transistor T1. The first pixel area PXA-R and the third pixel area PXA-B may have the same stacked structure as the second pixel area PXA-G.

The first display substrate 100 may include a first base layer BS1 (or, a base layer), a circuit layer CL, a light emitting element layer EL, and a thin film encapsulation layer TFE. The circuit layer CL may be disposed on the first base layer BS1. The circuit layer CL may include a plurality of insulating layers, a plurality of conductive layers, and a semiconductor layer. The light emitting element layer EL may be disposed on the circuit layer CL. The thin film encapsulation layer TFE may be disposed on the light emitting element layer EL and may seal the light emitting element layer EL.

The first base layer BS1 may be a silicon substrate, a plastic substrate, a glass substrate, an insulating film, or a stacked structure including a plurality of insulating layers.

A light blocking pattern BML may be disposed on the first base layer BS1. The light blocking layer BML may contain metal. A signal line may be disposed on the same layer as the light blocking pattern BML. A first insulating layer 10 that covers the light blocking pattern BML is disposed on the first base layer BS1.

A semiconductor pattern overlapping the light blocking pattern BML is disposed on the first insulating layer 10. The semiconductor pattern may have different electrical properties depending on whether the semiconductor pattern is doped or not. The semiconductor pattern may include a first area having a high conductivity and a second area having a low conductivity. The first area may be doped with an N-type or kind dopant or a P-type or kind dopant. A P-type or channel transistor may include a doped area doped with a P-type or kind dopant, and an N-type or channel transistor may include a doped area doped with an N-type or kind dopant. The second area may be an undoped area, or may be an area more lightly doped than the first area.

The semiconductor pattern may include a source area S1, a channel area A1 (or, an active area), and a drain area D1. A second insulating layer 20 is disposed on the first insulating layer 10. The second insulating layer 20 has contact holes CNT1 defined therein to expose the source area S1 and the drain area D1. The first insulating layer 10 and the second insulating layer 20 may be inorganic layers.

Connecting electrodes CNE1 and CNE2 are disposed on the second insulating layer 20. The first connecting electrode CNE1 may electrically connect the source area S1 of the first transistor T1 to the drain D3 of the third transistor T3 illustrated in FIG. 2. The second connecting electrode CNE2 electrically connects the drain D1 of the first transistor T1 to the signal line in FIG. 2 that receives the first voltage ELVDD illustrated in FIG. 2.

A third insulating layer 30 is disposed on the second insulating layer 20. A third connecting electrode CNE3 is disposed on the third insulating layer 30. The third connecting electrode CNE3 may be connected to the first connecting electrode CNE1 through a contact hole CNT2 penetrating the third insulating layer 30. A fourth insulating layer 40 is disposed on the third insulating layer 30. Anodes AE1, AE2, and AE3 are disposed on the fourth insulating layer 40. The anode AE2 may be connected to the third connecting electrode CNE3 through a contact hole (e.g., a contact via) CNT3 penetrating the fourth insulating layer 40. The third insulating layer 30 and the fourth insulating layer 40 may be organic layers.

A light emitting element OLED and a pixel defining film PDL are disposed on the fourth insulating layer 40. Pixel openings OP of the pixel defining film PDL expose at least portions of the anodes AE1, AE2, and AE3. The pixel openings OP of the pixel defining film PDL may define emissive areas EA1, EA2, and EA3. The area where the pixel defining film PDL is disposed may be defined as a non-emissive area NEA.

A hole control layer HCL may be commonly disposed in the emissive areas EA1, EA2, and EA3 and the non-emissive area NEA. A common layer, such as the hole control layer HCL, may be disposed in the display area DA to overlap the plurality of unit pixels PXU. The hole control layer HCL may include a hole transporting layer and a hole injection layer.

An emissive layer EML is disposed on the hole control layer HCL. The emissive layer EML may be commonly disposed in the emissive areas EA1, EA2, and EA3 and the non-emissive area NEA. The emissive layer EML may generate source light. The emissive layer EML may contain an organic light emitting material or an inorganic light emitting material. In this embodiment, the source light may be blue light. Hereinafter, the source light will be described as first color light.

An electron control layer ECL is disposed on the emissive layer EML. The electron control layer ECL may include an electron transporting layer and an electron injection layer. A cathode CE is disposed on the electron control layer ECL. The thin film encapsulation layer TFE is disposed on the cathode CE. The thin film encapsulation layer TFE is commonly disposed for the plurality of pixels PX. In this embodiment, the thin film encapsulation layer TFE directly covers the cathode CE.

The thin film encapsulation layer TFE includes at least one of an inorganic layer or an organic layer. The thin film encapsulation layer TFE may include a first inorganic encapsulation layer ITL1, an organic encapsulation layer OTL, and a second inorganic encapsulation layer ITL2 that are sequentially stacked one above another. The organic encapsulation layer OTL may be disposed between the first inorganic encapsulation layer ITL1 and the second inorganic encapsulation layer ITL2. The first inorganic encapsulation layer ITL1 and the second inorganic encapsulation layer ITL2 may be formed by depositing an inorganic material, and the organic encapsulation layer OTL may be formed by depositing, printing, or coating an organic material.

The first inorganic encapsulation layer ITL1 and the second inorganic encapsulation layer ITL2 protect the light emitting element layer EL from moisture and oxygen, and the organic encapsulation layer OTL protects the light emitting element layer EL from foreign matter such as dust particles. The first inorganic encapsulation layer ITL1 and the second inorganic encapsulation layer ITL2 may contain at least one of silicon nitride, silicon oxy-nitride, silicon oxide, titanium oxide, or aluminum oxide. The organic encapsulation layer OTL may include a polymer, for example, an acrylate-based organic layer. However, this is illustrative, and the present disclosure is not limited thereto.

In FIG. 3B, the thin film encapsulation layer TFE is illustrated as including the two inorganic layers and the one organic layer. However, the present disclosure is not limited thereto. For example, the thin film encapsulation layer TFE may include three inorganic layers and two organic layers. In this case, the inorganic layers and the organic layers may be alternately stacked one above another. In some embodiments, the display panel DP may further include, on the thin film encapsulation layer TFE, a refractive index control layer for improving light emission efficiency.

The second display substrate 200 may be disposed over the first display substrate 100. The second display substrate 200 may include a second base layer BS2 (or, a cover base layer), a color filter layer CFL, a light control layer CCL, a low refractive index layer LRL, a first capping layer CAP-T, and a second capping layer CAP.

The color filter layer CFL may be disposed under the second base layer BS2. The color filter layer CFL may include a first color filter CF1, a second color filter CF2, and a third color filter CF3.

The low refractive index layer LRL may be disposed under the color filter layer CFL. The low refractive index layer LRL may be disposed between the color filter layer CFL and the light control layer CCL.

The low refractive index layer LRL may be disposed over the light control layer CCL and may block or reduce exposure of light control patterns CCF-R, CCF-G, and CCF-B to moisture/oxygen. Furthermore, the low refractive index layer LRL may be disposed between the light control patterns CCF-R, CCF-G, and CCF-B and the color filters CF1, CF2, and CF3 and may serve as an optical functional layer that raises light extraction efficiency or prevents incidence of reflected light on the light control layer CCL.

The low refractive index layer LRL may have a lower refractive index than a layer adjacent thereto. Among light beams emitted upward from the light control layer CCL, light beams emitted at high angles may be recycled by being totally reflected by the low refractive index layer LRL to the light control layer CCL. Optical properties of the light beams totally reflected by the low refractive index layer LRL to the light control layer CCL may be changed by quantum dots contained in the light control layer CCL, and thus the light conversion efficiency of the light control layer CCL may be improved. The low refractive index layer LRL may cover the entire upper surface of the light control layer CCL.

The low refractive index layer LRL has a low refractive index. In an embodiment, the low refractive index layer LRL may have a refractive index of about 1.1 to about 1.4. As the low refractive index layer LRL has a low refractive index of about 1.1 to about 1.4, the low refractive index layer LRL may efficiently totally reflect the light beams that are emitted upward from the light control layer CCL at the high angles. The low refractive index layer LRL may have a high transmittance so as not to obstruct travel of the light beams emitted upward from the light control layer CCL. The low refractive index layer LRL may have a high transmittance of about 90% or more.

The low refractive index layer LRL may include at least one inorganic layer. For example, the low refractive index layer LRL may contain silicon nitride, aluminum nitride, zirconium nitride, titanium nitride, hafnium nitride, tantalum nitride, silicon oxide, aluminum oxide, titanium oxide, tin oxide, cerium oxide, or silicon oxy-nitride, or may include a metal thin film with secured light transmittance. However, without being limited thereto, the low refractive index layer LRL may include an organic film. For example, the low refractive index layer LRL may contain a polymer resin and inorganic particles. The low refractive index layer LRL may include a single layer or a plurality of layers.

The first capping layer CAP-T may be disposed on the low refractive index layer LRL. The first capping layer CAP-T may be disposed between the light control layer CCL and the color filter layer CFL. More specifically, the first capping layer CAP-T may be disposed between the light control layer CCL and the low refractive index layer LRL.

The first capping layer CAP-T may contain silicon oxy-nitride, like the second capping layer CAP. The composition ratio of silicon, oxygen, and nitrogen in the first capping layer CAP-T containing the silicon oxy-nitride may be in substantially the same range as the composition ratio of the second capping layer CAP. The first capping layer CAP-T may contain silicon oxy-nitride and may have a composition ratio of about 0.1 atomic % to about 15 atomic % nitrogen, about 45 atomic % to about 70 atomic % oxygen, and about 25 atomic % to about 40 atomic % silicon. However, without being limited thereto, the first capping layer CAP-T may contain silicon oxy-nitride, but may have a composition ratio different from the composition ratio of silicon, oxygen, and nitrogen in the second capping layer CAP. In some embodiments, the first capping layer CAP-T may not contain any silicon oxy-nitride and may contain silicon oxide or silicon nitride. In another case, the first capping layer CAP-T may contain titanium oxide or aluminum oxide.

The first capping layer CAP-T may have a lower refractive index than the light control layer CCL adjacent thereto. The refractive index of the first capping layer CAP-T may range from about 1.4 to about 1.8. For example, the first capping layer CAP-T may have a refractive index of about 1.4 to about 1.5 for light in the wavelength range of about 400 nm to about 700 nm.

In an embodiment, the first capping layer CAP-T may have a lower refractive index than the light control layer CCL adjacent thereto, and the difference in refractive index between the first capping layer CAP-T and the light control layer CCL may range from about 0.1 to about 0.25. For example, the difference in refractive index between the first capping layer CAP-T and the light control layer CCL may range from about 0.15 to about 0.2. In an embodiment, the refractive index of the light control layer CCL may range from about 1.6 to about 1.95.

The first capping layer CAP-T may have a higher refractive index than the low refractive index layer LRL adjacent thereto. In an embodiment, the low refractive index layer LRL may have a refractive index of about 1.3 or less for light in the wavelength range of about 400 nm to about 700 nm. The low refractive index layer LRL having a low refractive index may raise light extraction efficiency and may prevent or reduce incidence of reflected light on the light control layer CCL. The first capping layer CAP-T having a higher refractive index than the low refractive index layer LRL adjacent thereto may allow the low refractive index layer LRL to have a property of increasing light extraction efficiency and a property of preventing or reducing reflection.

The first capping layer CAP-T may have a thickness of about 2000 Å to about 12000 Å. For example, the first capping layer CAP-T may have a thickness of about 4000 Å to about 8000 Å. When the thickness of the first capping layer CAP-T is less than about 2000 Å, a property of blocking moisture and oxygen may be deteriorated so that moisture may infiltrate into the light control layer CCL, and durability may be decreased so that defects, such as lifting or film breakage, may occur. When the thickness of the first capping layer CAP-T exceeds about 12000 Å, it may be difficult to implement a film having a substantially uniform thickness and composition in a process so that film properties may be deteriorated, and due to the thick first capping layer CAP-T, stress applied to the second display substrate 200 may be increased so that damage to the substrate may occur.

The first capping layer CAP-T may be disposed on the low refractive index layer LRL to provide a flat surface (e.g., a planar surface) to the light control layer CCL.

The light control layer CCL may be disposed on the first capping layer CAP-T. The light control layer CCL may include the first light control pattern CCF-R, the second light control pattern CCF-G, and the third light control pattern CCF-B. The light control layer CCL may include a barrier wall BW between the first light control pattern CCF-R, the second light control pattern CCF-G, and the third light control pattern CCF-B. The first color filter CF1 may correspond to the first light control pattern CCF-R. The second color filter CF2 may correspond to the second light control pattern CCF-G. The third color filter CF3 may correspond to the third light control pattern CCF-B.

The second capping layer CAP may be disposed on the light control layer CCL. The second capping layer CAP may be directly disposed on the lower surface of the light control layer CCL and the lower surface BW-B of the barrier wall BW. For example, the second capping layer CAP may make contact with the lower surface of the light control layer CCL and the lower surface BW-B of the barrier wall BW.

The second capping layer CAP may cover the barrier wall BW, the first light control pattern CCF-R, the second light control pattern CCF-G, and the third light control pattern CCF-B. For example, the second capping layer CAP may be an inorganic film that seals the barrier wall BW, the first light control pattern CCF-R, the second light control pattern CCF-G, and the third light control pattern CCF-B.

The second capping layer CAP may contain silicon oxynitride SiON. The second capping layer CAP may have a thickness of about 2000 Å to about 12000 Å. For example, the second capping layer CAP may have a thickness of about 4000 Å to about 8000 Å. When the thickness of the second capping layer CAP is less than about 2000 Å, a property of blocking moisture and oxygen may be deteriorated so that moisture may infiltrate into the light control layer CCL, and durability may be decreased so that defects, such as lifting or film breakage, may occur. When the thickness of the second capping layer CAP exceeds about 12000 Å, it may be difficult to implement a film having a substantially uniform thickness and composition in a process so that film properties may be deteriorated, and due to the thick second capping layer CAP, stress applied to the second display substrate 200 may be increased so that damage to the substrate may occur.

The second capping layer CAP may have a refractive index of about 1.4 to about 1.8. The second capping layer CAP may have a refractive index of about 1.4 to about 1.8 for light in the wavelength range of about 400 nm to about 700 nm that is a visible light area. For example, the second capping layer CAP may have a refractive index of about 1.4 to about 1.5 for light in the wavelength range of about 400 nm to about 700 nm. As the second capping layer CAP satisfies the determined composition ratio of silicon, oxygen, and nitrogen, the second capping layer CAP may have a refractive index of about 1.4 to about 1.8 for light in the wavelength range of about 400 nm to about 700 nm. The second capping layer CAP may have a lower refractive index than a layer adjacent thereto. The second capping layer CAP may have a lower refractive index than the light control layer CCL adjacent thereto.

The second base layer BS2 may be a silicon substrate, a plastic substrate, a glass substrate, an insulating film, or a stacked structure including a plurality of insulating layers. The second base layer BS2 may have a flat lower surface BS2-B.

The plurality of color filters CF1, CF2, and CF3 may be disposed on one surface of the second base layer BS2. For example, the plurality of color filters CF1, CF2, and CF3 may be disposed on the lower surface BS2-B of the second base layer BS2. The first color filter CF1 may be disposed to overlap the first emissive area EA1, the second color filter CF2 may be disposed to overlap the second emissive area EA2, and the third color filter CF3 may be disposed to overlap the third emissive area EA3.

The third color filter CF3 may be disposed in the third pixel area PXA-B and the peripheral area NPXA. The third color filter CF3 may define a plurality of openings.

The plurality of openings may define the first pixel area PXA-R and the second pixel area PXA-G. The first color filter CF1 may be disposed to overlap the first pixel area PXA-R, and the second color filter CF2 may be disposed to overlap the second pixel area PXA-G.

Each of the first to third color filters CF1, CF2, and CF3 transmits light in a specific wavelength range and blocks light outside the corresponding wavelength range. Each of the first to third color filters CF1, CF2, and CF3 contains a base resin and a pigment and/or a dye dispersed in the base resin. The base resin may be a medium in which the dye and/or the pigment is dispersed and may be composed of one or more suitable resin compositions that are generally referred to as binders.

The first color filter CF1 may be to transmit second color light, the second color filter CF2 may transmit third color light, and the third color filter CF3 may transmit the first color light that is the source light provided from the emissive layer EML. For example, the first color filter CF1 may be a red color filter, the second color filter CF2 may be a green color filter, and the third color filter CF3 may be a blue color filter. In an embodiment, the first color filter CF1 and the second color filter CF2 may be yellow color filters. In this case, the first color filter CF1 and the second color filter CF2 may be provided in a state of being connected with each other.

The first color filter CF1 may be disposed adjacent to the second color filter CF2. The third color filter CF3 may overlap the first color filter CF1 and the second color filter CF2. The area where all of the color filters CF1, CF2, and CF3 overlap one another may block or reduce light. In this case, a black matrix that contains a light blocking material may not be included. The area where all of the color filters CF1, CF2, and CF3 overlap one another may correspond to the peripheral area NPXA and may correspond to the barrier wall BW. The expression "correspond to" used herein refers to that two components overlap each other when viewed in the thickness direction DR3 of the display panel DP (e.g., in the plan view) and is not limited to having the same area.

The barrier wall BW may be disposed under the first capping layer CAP-T. The barrier wall BW may be disposed in the peripheral area NPXA. The barrier wall BW may have a plurality of openings BW-OP defined therein. For example, the plurality of openings BW-OP may be surrounded by the barrier wall BW. The barrier wall BW may contain a material having a transmittance of a set or predetermined value or less. For example, the barrier wall BW may contain a light blocking material and may contain, for example, a black coloring agent. The barrier wall BW may contain a black dye or a black pigment mixed in a base resin. For example, the barrier wall BW may contain at least one of propylene glycol methyl ether acetate, 3-methoxy-n-butyl acetate, an acrylate monomer, an acrylic monomer, an organic pigment, or acrylate ester.

The plurality of openings BW-OP may correspond to the first pixel area PXA-R, the second pixel area PXA-G, and the third pixel area PXA-B, respectively. The plurality of openings BW-OP may correspond to the first emissive area EA1, the second emissive area EA2, and the third emissive area EA3, respectively. The expression "correspond to" used herein refers to that two components overlap each other when viewed in the thickness direction DR3 of the display panel DP and is not limited to having the same area.

The first light control pattern CCF-R may be disposed in one of the plurality of openings BW-OP and may convert the first color light into the second color light. The second light control pattern CCF-G may be disposed in another one of the plurality of openings BW-OP and may convert the first color light into the third color light. The third light control pattern CCF-B may be disposed in the other one of the plurality of openings BW-OP and may transmit the first color light.

Each of the first light control pattern CCF-R, the second light control pattern CCF-G, and the third light control pattern CCF-B may be formed by an inkjet process. The first light control pattern CCF-R, the second light control pattern CCF-G, and the third light control pattern CCF-B may be formed by providing compositions into the spaces defined by the barrier wall BW, for example, the plurality of openings BW-OP.

At least some selected from among the first light control pattern CCF-R, the second light control pattern CCF-G, and the third light control pattern CCF-B may contain quantum dots. The at least one light control pattern comprising the quantum dot may have a thickness of about 0.4 um or more. Each remaining light control pattern not comprising any quantum dot may have a smaller thickness than the at least one light control pattern comprising the quantum dot.

For example, each of the first light control pattern CCF-R and the second light control pattern CCF-G may contain a base resin, quantum dots, and scattering particles, and the third light control pattern CCF-B may contain a base resin and scattering particles. In an embodiment of the present disclosure, the scattering particles may not be provided from one of the first light control pattern CCF-R, the second light control pattern CCF-G, or the third light control pattern CCF-B.

The base resin may be a medium in which the quantum dots or the scattering particles are dispersed and may be composed of one or more suitable resin compositions that are generally referred to as binders. However, the present disclosure is not limited thereto, and in this specification, any medium capable of dispersing quantum dots may be referred to as a base resin irrespective of the name, other additional functions, constituent materials, and/or the like. The base resin may be a polymer resin. For example, the base resin may be an acrylate-based resin, a urethane-based resin, a silicone-based resin, or an epoxy-based resin. The base resin may be a transparent resin.

The scattering particles may be titanium oxide (e.g., $TiO_2$ or TiOx) or silica-based nanoparticles. The scattering particles may scatter incident light to increase the amount of light provided from the outside. In an embodiment of the present disclosure, at least one of the first light control pattern CCF-R or the second light control pattern CCF-G may not contain the scattering particles (e.g., any scattering particle).

The quantum dots may be particles that convert the wavelength of incident light. The quantum dots are materials having a crystal structure with a size of several nanometers and are composed of hundreds to thousands of atoms. The quantum dots exhibit a quantum confinement effect in which an energy band gap is increased due to a small size. When light having energy higher than the band gap is directed on the quantum dots, the quantum dots are excited by absorbing the light and fall to a ground state while emitting light having a specific wavelength. The emitted light has a value corresponding to the band gap. Light emission characteristics by the quantum confinement effect may be adjusted by controlling the size and composition of the quantum dots.

The core of each of the quantum dots may be selected from a Group II-VI compound, a Group III-V compound, a Group IV-VI compound, a Group IV element, a Group IV compound, and combinations thereof.

The Group II-VI compound may be selected from the group consisting of a binary compound selected from the group consisting of CdSe, CdTe, CdS, ZnS, ZnSe, ZnTe, ZnO, HgS, HgSe, HgTe, MgSe, MgS, and mixtures thereof, a ternary compound selected from the group consisting of CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures thereof, and a quaternary compound selected from the group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures thereof.

A Group III-VI compound may include a binary compound such as $In_2S_3$ or $In_2Se_3$, a ternary compound such as $InGaS_3$ or $InGaSe_3$, or a combination thereof.

A Group compound may be selected from a ternary compound selected from the group consisting of AgInS, $AgInS_2$, $CuInS$, $CuInS_2$, $AgGaS_2$, $CuGaS_2$, $CuGaO_2$, $AgGaO_2$, $AgAlO_2$, and mixtures thereof or a quaternary compound such as $AgInGaS_2$ or $CuInGaS_2$.

The Group III-V compound may be selected from the group consisting of a binary compound selected from the group consisting of GaN, GaP, GaAs, GaSb, AlN, AlP, AlAs, AlSb, InN, InP, InAs, InSb, and mixtures thereof, a ternary compound selected from the group consisting of GaNP, GaNAs, GaNSb, GaPAs, GaPSb, AlNP, AlNAs, AlNSb, AlPAs, AlPSb, InGaP, InAlP, InNP, InNAs, InNSb, InPAs, InPSb, and mixtures thereof, and a quaternary compound selected from the group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof. In some embodiments, the Group III-V compound may further include a Group II metal. For example, InZnP may be selected as a Group III-II-V compound.

The Group IV-VI compound may be selected from the group consisting of a binary compound selected from the group consisting of SnS, SnSe, SnTe, PbS, PbSe, PbTe, and mixtures thereof, a ternary compound selected from the group consisting of SnSeS, SnSeTe, SnSTe, PbSeS, PbSeTe, PbSTe, SnPbS, SnPbSe, SnPbTe, and mixtures thereof, and a quaternary compound selected from the group consisting of SnPbSSe, SnPbSeTe, SnPbSTe, and mixtures thereof. The Group IV element may be selected from the group consisting of Si, Ge, and a mixture thereof. The Group IV compound may be a binary compound selected from the group consisting of SiC, SiGe, and a mixture thereof.

In this case, the binary compound, the ternary compound, or the quaternary compound may exist in the particle in substantially uniform concentration, or may exist in substantially the same particle with partially different concentration distribution. In some embodiments, the quantum dots may have a core-shell structure in which one quantum dot surrounds (e.g., encapsulates) another quantum dot. The interface between the core and the shell may have a concentration gradient in which the concentration of an element existing in the shell is lowered toward the center.

In some embodiments, the quantum dots may have a core-shell structure that includes a core including a nanocrystal and a shell around (e.g., surrounding) the core. The shell of each quantum dot may serve as a protective layer for maintaining semiconductor characteristics by preventing or reducing chemical modification of the core and/or a charging layer for imparting electrophoretic characteristics to the quantum dot. The shell may have a single layer or multiple layers. The interface between the core and the shell may have a concentration gradient in which the concentration of an element existing in the shell is lowered toward the center. The shell of the quantum dot may be exemplified by metal oxide, non-metal oxide, a semiconductor compound, or a combination thereof.

For example, the metal oxide or the non-metal oxide may include, but is not limited to, a binary compound such as $SiO_2$, $AL_2O_3$, $TiO_2$, $ZnO$, $MnO$, $Mn_2O_3$, $CuO$, $FeO$, $Fe_2O_3$, $Fe_3O_4$, $CoO$, $Co_3O_4$, or $NiO$, or a ternary compound such as $MgAl_2O_4$, $CoFe_2O_4$, $NiFe_2O_44$, or $CoMn_2O_4$.

The semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, or AlSb. However, the present disclosure is not limited thereto.

The quantum dots may have a full width at half maximum (FWHM) of a light emission wavelength spectrum that is about 45 nm or less, about 40 nm or less, or about 30 nm or less and may improve color purity or color reproduction in the range. Furthermore, light emitted through the quantum dots may be emitted in all directions, and thus a wide viewing angle may be improved.

The form of the quantum dots is not particularly limited to a form generally used in the related art. More specifically, a nanoparticle, a nanotube, a nanowire, a nanofiber, or a nanoplatelet particle that has a spherical, pyramidal, multi-arm, or cubic shape may be used.

The quantum dots may adjust the color of emitted light depending on the particle sizes. Accordingly, the quantum dots may have one or more suitable light emission colors such as blue, red, and green.

Figure 3C:
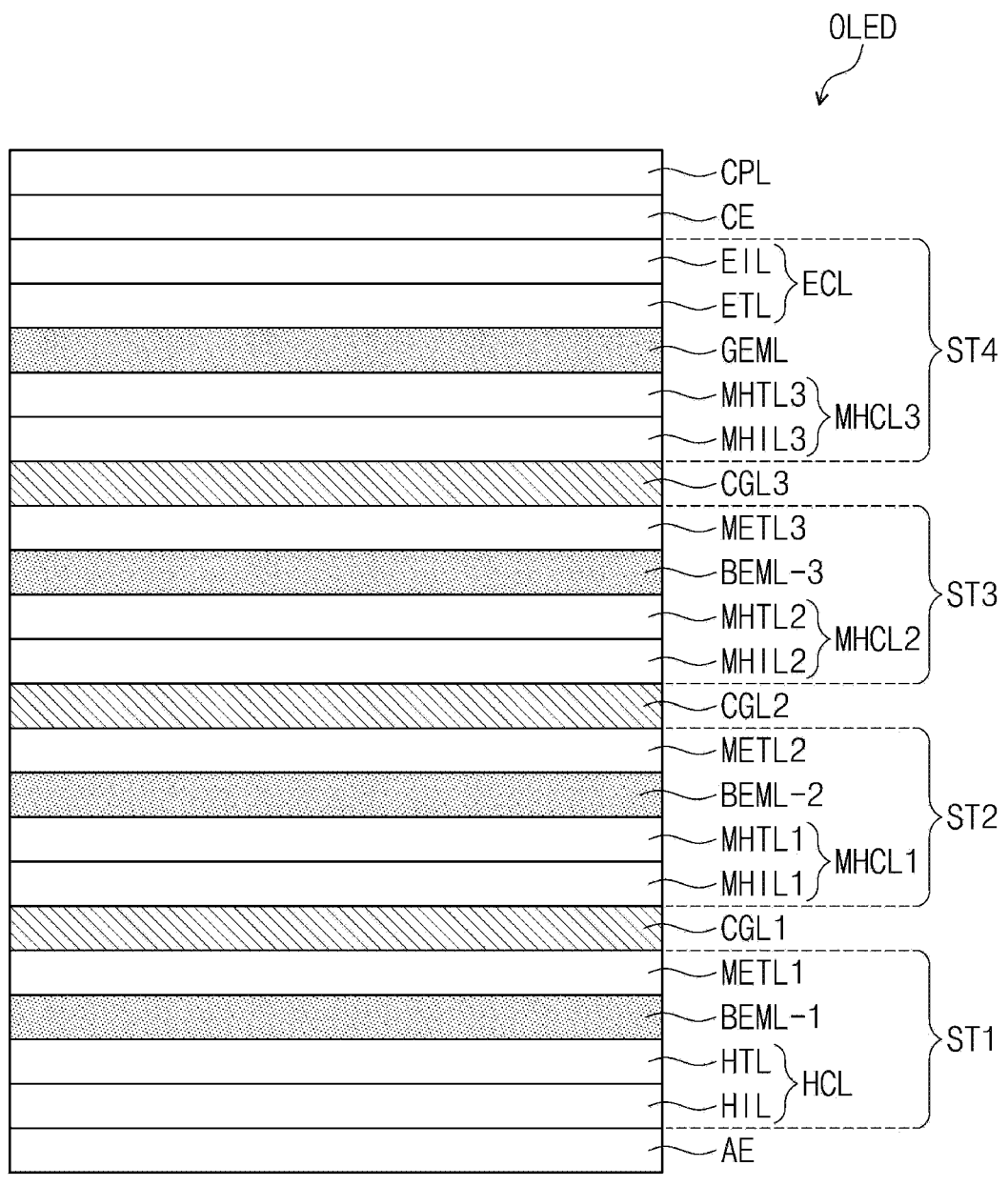
FIG. 3C is a sectional view of a light emitting element included in the display panel according to an embodiment of the present disclosure.

FIG. 3C is a sectional view of a light emitting element included in the display panel according to an embodiment of the present disclosure.

FIG. 3C illustrates a light emitting element OLED including a plurality of light emitting stacks ST1, ST2, ST3, and ST4 unlike the light emitting element according to the embodiment illustrated in FIG. 3B.

Referring to FIG. 3C, the light emitting element OLED according to an embodiment may include a first electrode AE, a second electrode CE facing the first electrode AE, and the first to fourth light emitting stacks ST1, ST2, ST3, and ST4 disposed between the first electrode AE and the second electrode CE. Although FIG. 3C illustrates one example that the light emitting element OLED includes the four light emitting stacks, the light emitting element OLED may include more or fewer light emitting stacks.

In some embodiments, the light emitting element OLED may further include a capping layer CPL disposed on the second electrode CE. The capping layer CPL may have a single-layer structure or a multi-layer structure. The capping layer CPL may include an organic layer or an inorganic layer. For example, the inorganic layer of the capping layer CPL may contain at least one of an alkali metal compound such as LiF, an alkaline earth metal compound such as $MgF_2$, silicon nitride, silicon oxy-nitride, or silicon oxide. The organic layer of the capping layer CPL may contain α-NPD, NPB, TPD, m-MTDATA, Alq3, CuPc, TCTA, an epoxy resin, or an acrylate-based resin. However, the material of the capping layer CPL is not limited thereto.

The light emitting element OLED may include first to third charge generation layers CGL1, CGL2, and CGL3 disposed between the first to fourth light emitting stacks ST1, ST2, ST3, and ST4.

The first to third charge generation layers CGL1, CGL2, and CGL3 may generate charges (electrons and holes) by forming complexes through an oxidation-reduction reaction when a voltage is applied thereto. Thereafter, the first to third charge generation layers CGL1, CGL2, and CGL3 may provide the generated charges to the light emitting stacks ST1, ST2, ST3, and ST4 adjacent thereto. The first to third charge generation layers CGL1, CGL2, and CGL3 may double the efficiency of currents generated from the adjacent light emitting stacks ST1, ST2, ST3, and ST4 and may serve to adjust the balance of the charges between the adjacent light emitting stacks ST1, ST2, ST3, and ST4.

Each of the first to third charge generation layers CGL1, CGL2, and CGL3 may include an n-type layer (e.g., N-charge layer) and a p-type layer (e.g., P-charge layer). The first to third charge generation layers CGL1, CGL2, and CGL3 may have a structure in which the n-type layer (e.g., N-charge layer) and the p-type layer (e.g., P-charge layer) are bonded to each other. However, without being limited thereto, the first to third charge generation layers CGL1, CGL2, and CGL3 may include only one selected from among the n-type layer and the p-type layer. The n-type layer may be a charge generation layer that provides electrons to an adjacent light emitting stack. The n-type layer may be a layer in which a base material is doped with an n-dopant. The p-type layer may be a charge generation layer that provides holes to an adjacent light emitting stack.

In an embodiment, the first to third charge generation layers CGL1, CGL2, and CGL3 may have a thickness of about 1 angstrom (Å) to about 150 angstrom (Å). The concentration of the n-dopant (e.g., N-dopant) doped in the first to third charge generation layers CGL1, CGL2, and CGL3 may range from about 0.1% to about 3% and specifically may be about 1% or less. When the concentration is less than about 0.1%, effects of the first to third charge generation layers CGL1, CGL2, and CGL3 that adjust the balance of charges may not occur almost at all. When the concentration is more than about 3%, the light efficiency of the light emitting element OLED may be lowered.

Each of the first to third charge generation layers CGL1, CGL2, and CGL3 may contain a charge generation compound consisting of an aryl amine-based organic compound, metal, metal oxide, carbide, fluoride, or a mixture thereof. For example, the aryl amine-based organic compound may include α-NPD, 2-TNATA, TDATA, MTDATA, sprio-TAD, or sprio-NPB. The metal may include cesium (Cs), molybdenum (Mo), vanadium (V), titanium (Ti), tungsten (W), barium (Ba), or lithium (Li). The metal oxide, the carbide, and the fluoride may include $Re_2O_7$, $MoO_3$, $V_2O_5$, $WO_3$, $TiO_2$, $Cs_2CO_3$, BaF, LiF, or CsF. However, the materials of the first to third charge generation layers CGL1, CGL2, and CGL3 are not limited thereto.

The first to fourth light emitting stacks ST1, ST2, ST3, and ST4 may include emissive layers, respectively. The first light emitting stack ST1 may include a first emissive layer BEML-1. The second light emitting stack ST2 may include a second emissive layer BEML-2. The third light emitting stack ST3 may include a third emissive layer BEML-3. The fourth light emitting stack ST4 may include a fourth emissive layer GEML. Some of the emissive layers included in the first to fourth light emitting stacks ST1, ST2, ST3, and ST4 may emit substantially the same color light, and the other emissive layers may emit different color light.

In an embodiment, the first to third emissive layers BEML-1, BEML-2, and BEML-3 of the first to third light emitting stacks ST1, ST2, and ST3 may emit substantially the same first color light. For example, the first color light may be blue light that is the above-described source light. The light emitted by the first to third emissive layers BEML-1, BEML-2, and BEML-3 may have a wavelength range of about 420 nm to about 480 nm.

The fourth emissive layer GEML of the fourth light emitting stack ST4 may emit the second color light different from the first color light. For example, the second color light may be green light. The light emitted by the fourth emissive layer GEML may have a wavelength range of about 520 nm to about 600 nm.

At least some of the first to fourth emissive layers BEML-1, BEML-2, BEML-3, and GEML may have a bi-layer structure including different host materials. For example, one layer of the bi-layer structure may contain a hole transporting host material, and the other layer may contain an electron transporting host material. The electron transporting host material may be a material containing an electron transporting moiety in a molecular structure.

The first light emitting stack ST1 may include a hole control layer HCL that transports holes provided from the first electrode AE to the first emissive layer BEML-1 and a first intermediate electron control layer METL1 that transports electrons generated from the first charge generation layer CGL1 to the first emissive layer BEML-1.

The hole control layer HCL may include a hole injection layer HIL disposed on the first electrode AE and a hole transporting layer HTL disposed on the hole injection layer HIL. However, without being limited thereto, the hole control layer HCL may further include at least one of a hole buffer layer, a light-emission assisting layer, or an electron blocking layer. The hole buffer layer may be a layer that increases light emission efficiency by compensating for the resonance distance depending on the wavelength of light emitted from the emissive layer. The electron blocking layer may be a layer that serves to prevent or reduce electron injection from the electron control layer to the hole control layer.

The first intermediate electron control layer METL1 may include a first intermediate electron transporting layer disposed on the first emissive layer BEML-1. However, without being limited thereto, the first intermediate electron control layer METL1 may further include at least one of an electron buffer layer or a hole blocking layer.

The second light emitting stack ST2 may include a first intermediate hole control layer MHCL1 that transports holes generated from the first charge generation layer CGL1 to the second emissive layer BEML-2 and a second intermediate electron control layer METL2 that transports electrons provided from the second charge generation layer CGL2 to the second emissive layer BEML-2.

The first intermediate hole control layer MHCL1 may include a first intermediate hole injection layer MHIL1 disposed on the first charge generation layer CGL1 and a first intermediate hole transporting layer MHTL1 disposed on the first intermediate hole injection layer MHIL1. The first intermediate hole control layer MHCL1 may further include at least one of a hole buffer layer, a light-emission assisting layer, or an electron blocking layer that are (is) disposed on the first intermediate hole transporting layer MHTL1.

The second intermediate electron control layer METL2 may include a second intermediate electron transporting layer disposed on the second emissive layer BEML-2. However, without being limited thereto, the second intermediate electron control layer METL2 may further include at least one of an electron buffer layer or a hole blocking layer that are (is) disposed between the second intermediate electron transporting layer and the second emissive layer BEML-2.

The third light emitting stack ST3 may include a second intermediate hole control layer MHCL2 that transports holes generated from the second charge generation layer CGL2 to the third emissive layer BEML-3 and a third intermediate electron control layer METL3 that transports electrons provided from the third charge generation layer CGL3 to the third emissive layer BEML-3.

The second intermediate hole control layer MHCL2 may include a second intermediate hole injection layer MHIL2 disposed on the second charge generation layer CGL2 and a second intermediate hole transporting layer MHTL2 disposed on the second intermediate hole injection layer MHIL2. However, without being limited thereto, the second intermediate hole control layer MHCL2 may further include at least one of a hole buffer layer, a light-emission assisting layer, or an electron blocking layer that are (is) disposed on the second intermediate hole transporting layer MHTL2.

The third intermediate electron control layer METL3 may include a third intermediate electron transporting layer disposed on the third emissive layer BEML-3. However, without being limited thereto, the third intermediate electron control layer METL3 may further include at least one of an electron buffer layer or a hole blocking layer that are (is) disposed between the third intermediate electron transporting layer and the third emissive layer BEML-3.

The fourth light emitting stack ST4 may include a third intermediate hole control layer MHCL3 that transports holes generated from the third charge generation layer CGL3 to the fourth emissive layer GEML and an electron control layer ECL that transports electrons provided from the second electrode CE to the fourth emissive layer GEML.

The third intermediate hole control layer MHCL3 may include a third intermediate hole injection layer MHIL3 disposed on the third charge generation layer CGL3 and a third intermediate hole transporting layer MHTL3 disposed on the third intermediate hole injection layer MHIL3. However, without being limited thereto, the third intermediate hole control layer MHCL3 may further include at least one of a hole buffer layer, a light-emission assisting layer, or an electron blocking layer that are (is) disposed on the third intermediate hole transporting layer MHTL3.

The electron control layer ECL may include an electron transporting layer ETL disposed on the fourth emissive layer GEML and an electron injection layer EIL disposed on the electron transporting layer ETL. However, without being limited thereto, the electron control layer ECL may further include at least one of an electron buffer layer or a hole blocking layer that are (is) disposed between the electron transporting layer ETL and the fourth emissive layer GEML.

In an embodiment, the light emitting element OLED may emit light in the direction from the first electrode AE to the second electrode CE, and based on the direction in which the light is emitted, the hole control layer HCL may be disposed at the bottom of the plurality of light emitting stacks ST1, ST2, ST3, and ST4, and the electron control layer ECL may be disposed at the top of the plurality of light emitting stacks ST1, ST2, ST3, and ST4. However, without being limited thereto, the light emitting element OLED may have an inverted element structure in which, based on the light emission direction, the electron control layer ECL is disposed at the bottom of the plurality of light emitting stacks ST1, ST2, ST3, and ST4 and the hole control layer HCL is disposed at the top of the plurality of light emitting stacks ST1, ST2, ST3, and ST4.

Referring again to FIG. 3B, the electron control layer ECL may be disposed between the emissive layer EML and the second electrode CE. The electron control layer ECL may include at least one of an electron injection layer, an electron transporting layer, or a hole blocking layer. Referring to FIG. 3B, the electron control layer ECL may be disposed as a common layer to overlap the emissive areas EA1, EA2, and EA3 and the entire pixel defining film PDL dividing the emissive areas EA1, EA2, and EA3. However, without being limited thereto, the electron control layer ECL may be subjected to patterning so as to be separated to correspond to the emissive areas EA1, EA2, and EA3.

The second electrode CE is provided on the electron control layer ECL. The second electrode CE may be a common electrode. The second electrode CE may be a cathode or an anode. However, the present disclosure is not limited thereto. For example, when the first electrodes AE1, AE2, and AE3 are anodes, the second electrode CE may be a cathode, and when the first electrodes AE1, AE2, and AE3 are cathodes, the second electrode CE may be an anode. The second electrode CE may be a transparent electrode, a translucent electrode, or a reflective electrode.

The encapsulation layer TFE may be disposed on the light emitting element OLED. For example, in an embodiment, the encapsulation layer TFE may be disposed on the second electrode CE. Furthermore, when the light emitting element OLED includes the capping layer CPL (refer to FIG. 3C), the encapsulation layer TFE may be disposed on the capping layer CPL. As described above, the encapsulation layer TFE may include one or more organic films and one or more inorganic films, and the inorganic films and the organic films may be disposed to alternate with one another.

The components of the display panel DP including the light control layer CCL have been described above. Hereinafter, low refractive index layers LRL according to embodiments of the present disclosure will be described in more detail with reference to FIGS. 4 to 9.

FIGS. 4 to 7 are sectional views illustrating some components of the display panel DP according to an embodiment of the present disclosure. FIGS. 4 to 7 focus on the light control layer CCL, the color filter layer CFL, and the low refractive index layer LRL that are included in the second display substrate 200 of the display panel DP according to the embodiment illustrated in FIG. 3B.

Figure 4:
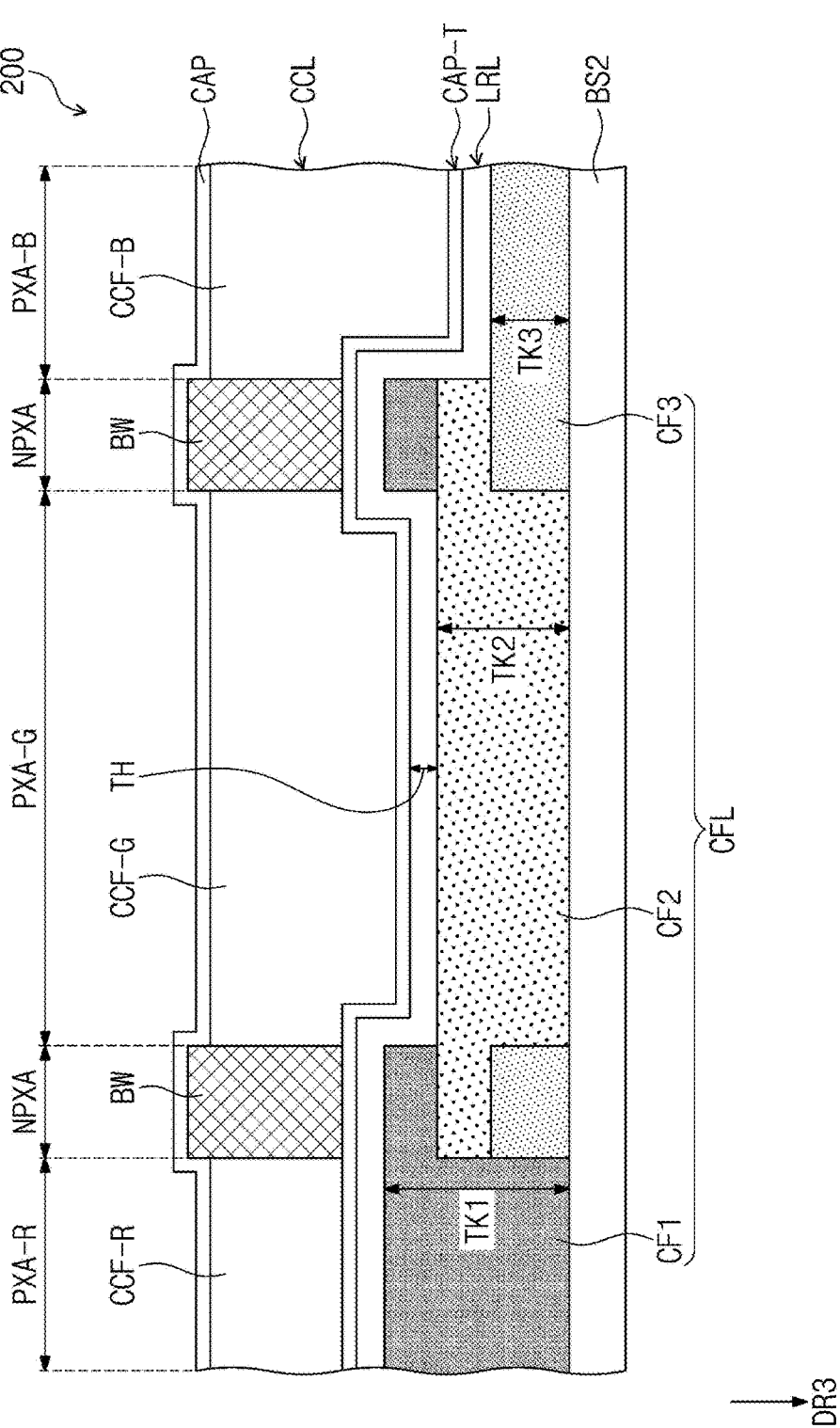
FIG. 4 is a sectional view illustrating a second display substrate according to an embodiment of the present disclosure.

FIG. 4 is a sectional view illustrating the second display substrate 200 according to an embodiment of the present disclosure.

Referring to FIG. 4, in the color filter layer CFL disposed on the second base layer BS2, the first color filter CF1, the second color filter CF2, and the third color filter CF3 may have different thicknesses. The thicknesses may correspond to the lengths of the first color filter CF1, the second color filter CF2, and the third color filter CF3 in the third direction DR3.

In an embodiment, the thickness TK1 of the first color filter CF1 may be greater than the thickness TK2 of the second color filter CF2, and the thickness TK2 of the second color filter CF2 may be greater than the thickness TK3 of the third color filter CF3.

The first color filter CF1, the second color filter CF2, and the third color filter CF3 have to have a low reflectivity to transmit the source light. For example, the first color filter CF1, the second color filter CF2, and the third color filter CF3 may have a reflectivity of less than about 1.1. The first color filter CF1, the second color filter CF2, and the third color filter CF3 may have different thicknesses so as to have a low reflectivity. For example, the thickness TK1 of the first color filter CF1 may be about 4.2 μm, the thickness TK2 of the second color filter CF2 may be about 3.2 μm, and the thickness TK3 of the third color filter CF3 may be about 3.0 μm.

The low refractive index layer LRL may be disposed on the color filter layer CFL. The low refractive index layer LRL disposed on the color filter layer CFL may recycle the unabsorbed source light to transmit the source light to the color filter layer CFL. The low refractive index layer LRL may be formed on the color filter layer CFL by coating.

The low refractive index layer LRL may have a thickness TH of about 0.2 μm to about 2.5 μm. Depending on the thickness of the color filter layer CFL, the thickness TH of the low refractive index layer LRL may be determined to be a thickness within the range of about 0.2 μm to about 2.5 μm.

In an embodiment, the low refractive index layer LRL may have a thickness TH of about 0.2 μm or more. When the low refractive index layer LRL has a thickness TH of about 0.2 μm or more, the reflectivity of the color filter layer CFL may be less than about 1.1. When the low refractive index layer LRL has a thickness TH of about 0.2 μm or more, white angle difference (WAD) characteristics may satisfy a luminance ratio of about 80% or more based on about 60 degrees.

When the low refractive index layer LRL has a thickness TH of about 0.2 μm or more, light efficiency by recycling may be raised by at least 5%. For example, when the low refractive index layer LRL has a thickness TH of about 0.2 μm or more, a low refractive index pattern may effectively function. In an embodiment, the low refractive index layer LRL may have a thickness TH of about 0.4 μm or more. Additional description will be given with reference to FIG. 8A.

In an embodiment, the low refractive index layer LRL may have a thickness TH of about 2.5 μm or less. The thickness TH of the low refractive index layer LRL may be determined within a thickness by which cracks do not occur during a process due to the peeling characteristics of the low refractive index pattern. For example, the thickness TH of the low refractive index layer LRL may be determined to be about 2.5 μm or less such that cracks do not occur during a coating process. However, without being limited thereto, the low refractive index layer LRL may have a thickness TH of about 3.0 μm or less. The maximum thickness of the low refractive index layer LRL may be determined to be not less than about 2.5 μm and not more than about 3.0 μm in a compensation structure in which a protective organic film is applied onto the low refractive index layer LRL.

In this embodiment, the thickness TH of the low refractive index layer LRL on the first color filter CF1, the second color filter CF2, and the third color filter CF3 that have different thicknesses may be equally determined in the range of about 0.2 μm to about 2.5 μm.

The first capping layer CAP-T may be disposed on the low refractive index layer LRL. The thickness of the first capping layer CAP-T on the low refractive index layer LRL having a thickness TH of about 0.2 μm to about 2.5 μm may be determined to be not less than about 2000 Å and not more than about 6000 Å.

Figure 5:
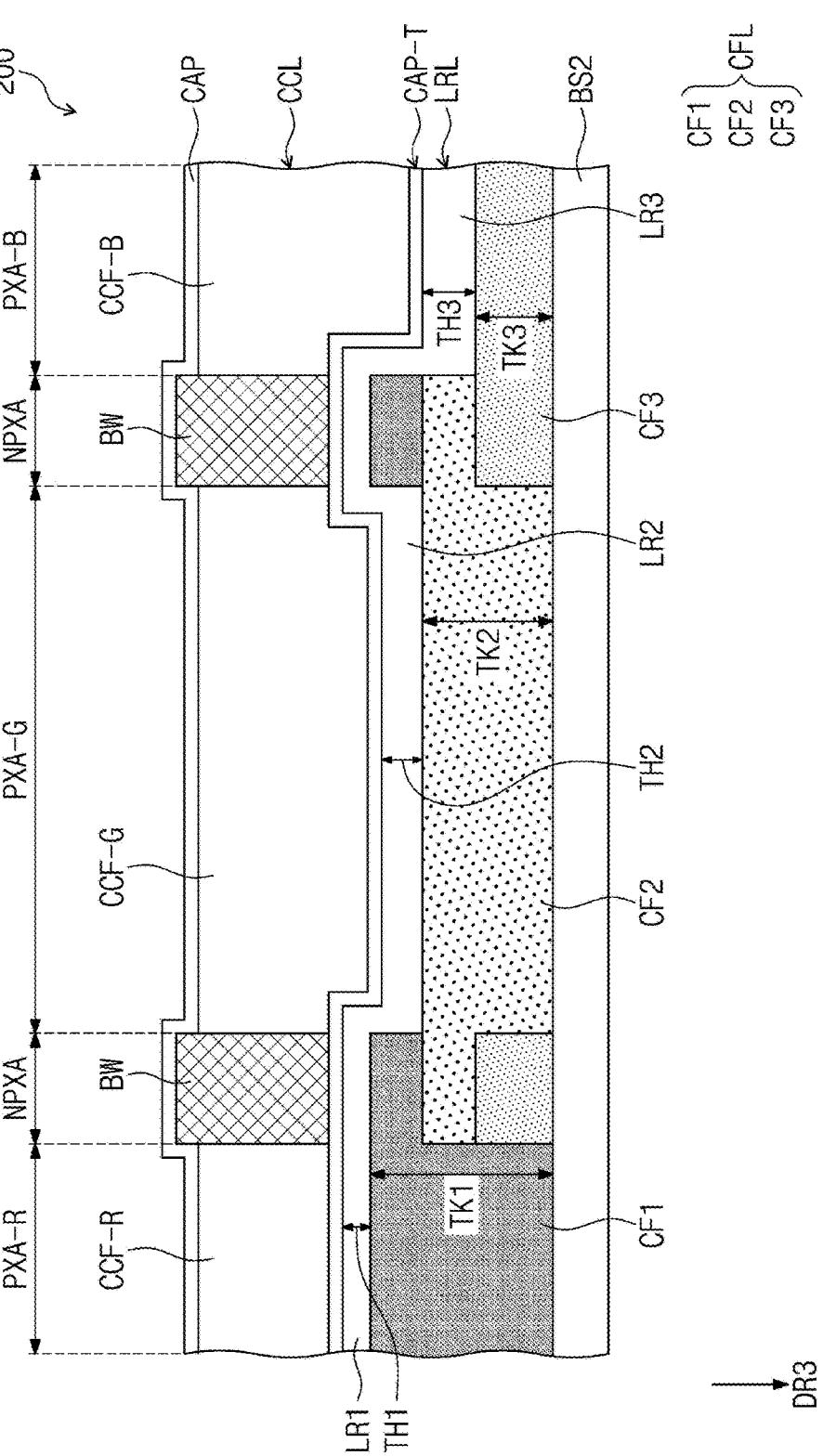
FIG. 5 is a sectional view illustrating a second display substrate according to an embodiment of the present disclosure.

FIG. 5 is a sectional view illustrating a second display substrate according to an embodiment of the present disclosure.

Referring to FIG. 5, a low refractive index layer LRL may include a first low refractive index pattern LR1, a second low refractive index pattern Lr2, and a third low refractive index pattern LR3.

The first low refractive index pattern LR1 corresponds to a first color filter CF1. The first low refractive index pattern LR1 may be disposed between the first color filter CF1 and a first light control pattern CCF-R. The second low refractive index pattern LR2 corresponds to a second color filter CF2. The second low refractive index pattern LR2 may be disposed between the second color filter CF2 and a second light control pattern CCF-G. The third low refractive index pattern LR3 corresponds to a third color filter CF3. The third low refractive index pattern LR3 may be disposed between the third color filter CF3 and a third light control pattern CCF-B.

The first low refractive index pattern LR1, the second low refractive index pattern LR2, and the third low refractive index pattern LR3 may have different thicknesses. For example, the first thickness TH1 of the first low refractive index pattern LR1 may differ from the second thickness TH2 of the second low refractive index pattern LR2, and the second thickness TH2 of the second low refractive index pattern LR2 may differ from the third thickness TH3 of the third low refractive index pattern LR3. The first thickness TH1 and the third thickness TH3 may also differ from each other.

In an embodiment, the thickness of the low refractive index layer LRL may be determined based on the thickness of a color filter layer CFL. As the thickness of the color filter layer CFL disposed under the low refractive index layer LRL is increased, the amount of reflow in a coating process of the low refractive index layer LRL may be increased so that the thickness of the low refractive index layer LRL may be decreased.

The first thickness TH1 of the first low refractive index pattern LR1 may be determined based on the thickness TK1 of the first color filter CF1, the second thickness TH2 of the second low refractive index pattern LR2 may be determined based on the thickness TK2 of the second color filter CF2, and the third thickness TH3 of the third low refractive index pattern LR3 may be determined based on the thickness TK3 of the third color filter CF3.

The thickness of the low refractive index layer LRL may be increased as the thickness of the color filter layer CFL is decreased. The first thickness TH1 of the first low refractive index pattern LR1 on the first color filter CF1 having the greatest thickness TK1 may be the smallest of the first thickness TH1, the second thickness TH2, and the third thickness TH3. The third thickness TH3 of the third low refractive index pattern LR3 on the third color filter CF3 having the smallest thickness TK3 may be the greatest of the first thickness TH1, the second thickness TH2, and the third thickness TH3. For example, the first thickness TH1 may be about 2.0 μm, the second thickness TH2 may be about 2.2 μm, and the third thickness TH3 may be about 2.4 μm. Even in this case, the thickness of the low refractive index layer LRL may be determined within the range of about 0.2 μm to about 2.5 μm.

For example, the thicknesses of the first low refractive index pattern LR1, the second low refractive index pattern LR2, and the third low refractive index pattern LR3 may be inversely proportional to the thicknesses of the first color filter CF1, the second color filter CF2, and the third color filter CF3 that correspond to the first low refractive index pattern LR1, the second low refractive index pattern LR2, and the third low refractive index pattern LR3.

Although FIGS. 4 and 5 illustrate one example that the thickness TK1 of the first color filter CF1 is the greatest of the thicknesses TK1, TK2, and TK3 and the thickness TK3 of the third color filter CF3 is the smallest of the thicknesses TK1, TK2, and TK3, the present disclosure is not necessarily limited thereto. For example, the thickness TK2 of the second color filter CF2 may be the greatest of the thicknesses TK1, TK2, and TK3, and the thickness TK1 of the first color filter CF1 may be the smallest of the thicknesses TK1, TK2, and TK3. In this case, in the low refractive index layer LRL, the second thickness TH2 of the second low refractive index pattern LR2 may be the smallest of the first to third thicknesses TH1, TH2, and TH3, and the first thickness TH1 of the first low refractive index pattern LR1 may be the greatest of the first to third thicknesses TH1, TH2, and TH3.

Figure 6A:
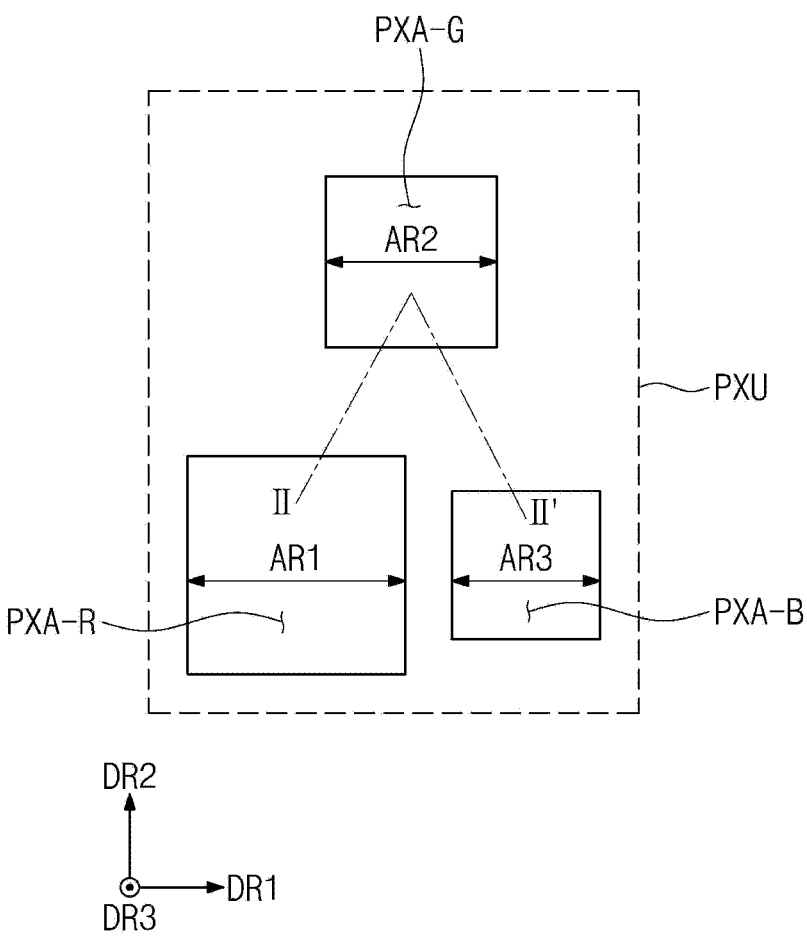
FIG. 6A is a view illustrating a unit pixel according to an embodiment of the present disclosure.
Figure 6B:
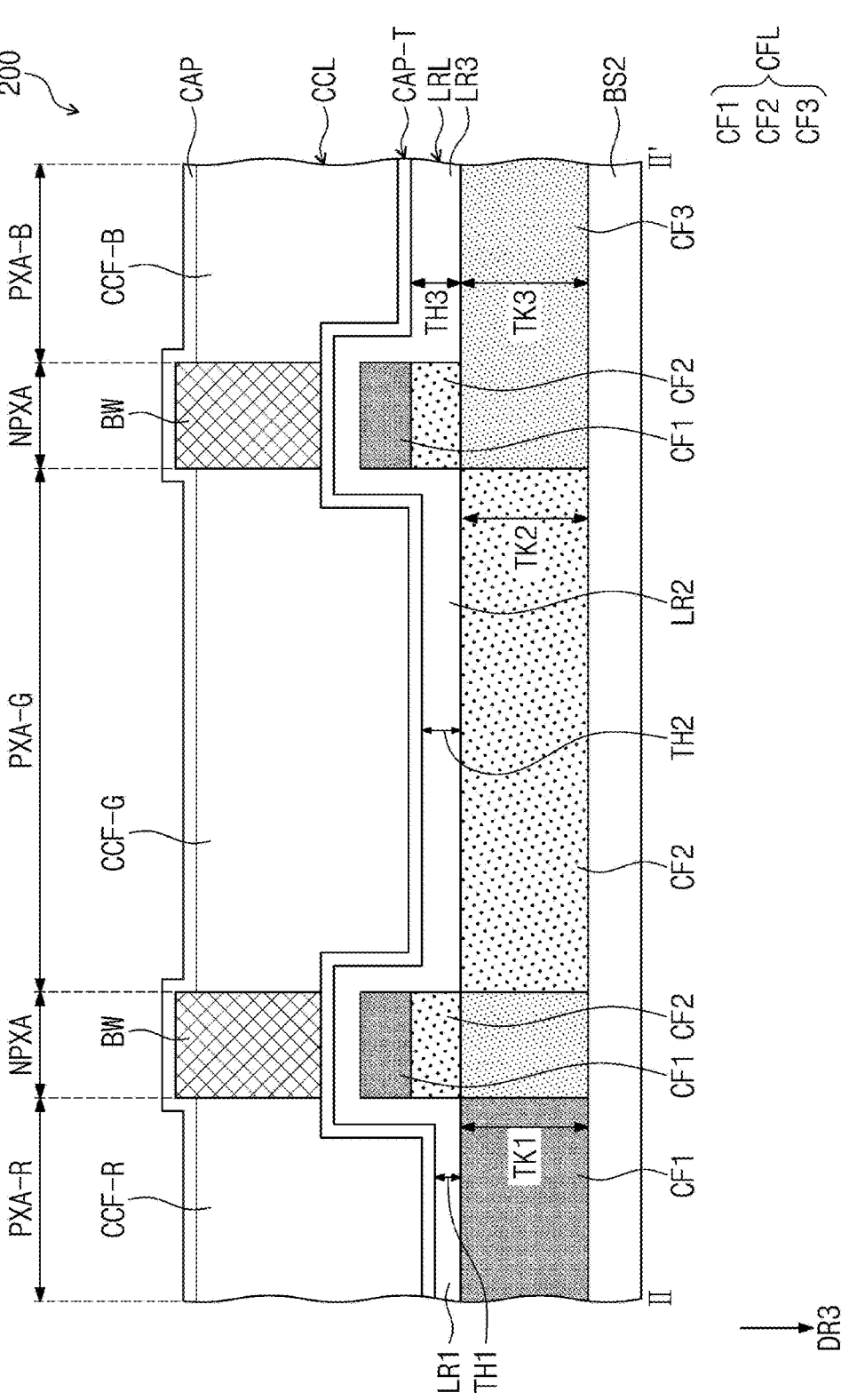
FIG. 6B is a sectional view taken along line II-II' of FIG. 6A.

FIG. 6A is a view illustrating a unit pixel according to an embodiment of the present disclosure. FIG. 6B is a sectional view taken along line II-II' of FIG. 6A.

In FIGS. 6A and 6B, a first pixel area PXA-R, a second pixel area PXA-G, and a third pixel area PXA-B may have different areas. In this embodiment, the first area AR1 of the first pixel area PXA-R is the greatest of the first to third areas AR1, AR2, and AR3, and the third area AR3 of the third pixel area PXA-B is the smallest of the first to third areas AR1, AR2, and AR3. The second area AR2 of the second pixel area PXA-G has a size between the first area AR1 and the third area AR3.

Referring to FIG. 6B, a first light control pattern CCF-R may be disposed in the first pixel area PXA-R, a second light control pattern CCF-G may be disposed in the second pixel area PXA-G, and a third light control pattern CCF-B may be disposed in the third pixel area PXA-B.

In FIG. 6B, the thicknesses TK1, TK2, and TK3 of first to third color filters CF1, CF2, and CF3 in a color filter layer CFL may all be the same.

The first thickness TH1 of a first low refractive index pattern LR1, the second thickness TH2 of a second low refractive index pattern LR2, and the third thickness TH3 of a third low refractive index pattern LR3 may differ from one another. The first thickness TH1, the second thickness TH2, and the third thickness TH3 may be determined based on the areas AR1, AR2, and AR3 of the first to third pixel areas PXA-R, PXA-G, and PXA-B irrespective of the thicknesses TK1, TK2, and TK3 of the first to third color filters CF1, CF2, and CF3.

As the areas AR1, AR2, and AR3 of the pixel areas PXA-R, PXA-G, and PXA-B on which the low refractive index patterns LR1, LR2, and LR3 are stacked in the low refractive index layer LRL are decreased, the amounts by which the low refractive index patterns LR1, LR2, and LR3 are stacked may be increased. Accordingly, as the areas AR1, AR2, and AR3 of the pixel areas PXA-R, PXA-G, and PXA-B are decreased, the thicknesses of the low refractive index patterns LR1, LR2, and LR3 may be increased. In this embodiment, the first thickness TH1 of the first low refractive index pattern LR1 stacked on the first area AR1 that is the greatest of the areas AR1, AR2, and AR3 of the first to third pixel areas PXA-R, PXA-G, and PXA-B may be the smallest of the first to third thicknesses TH1, TH2, and TH3. The third thickness TH3 of the third low refractive index pattern LR3 stacked on the third area AR3 that is the smallest of the first to third areas AR1, AR2, and AR3 may be the greatest of the first to third thicknesses TH1, TH2, and TH3 For example, the areas AR1, AR2, and AR3 of the pixel areas PXA-R, PXA-G, and PXA-B and the thicknesses of the low refractive index patterns LR1, LR2, and LR3 may be inversely proportional to each other.

In this case, the first to third color filters CF1, CF2, and CF3 may all have the same thickness. However, without being limited thereto, the first to third color filters CF1, CF2, and CF3 may have different thicknesses.

Figure 7:
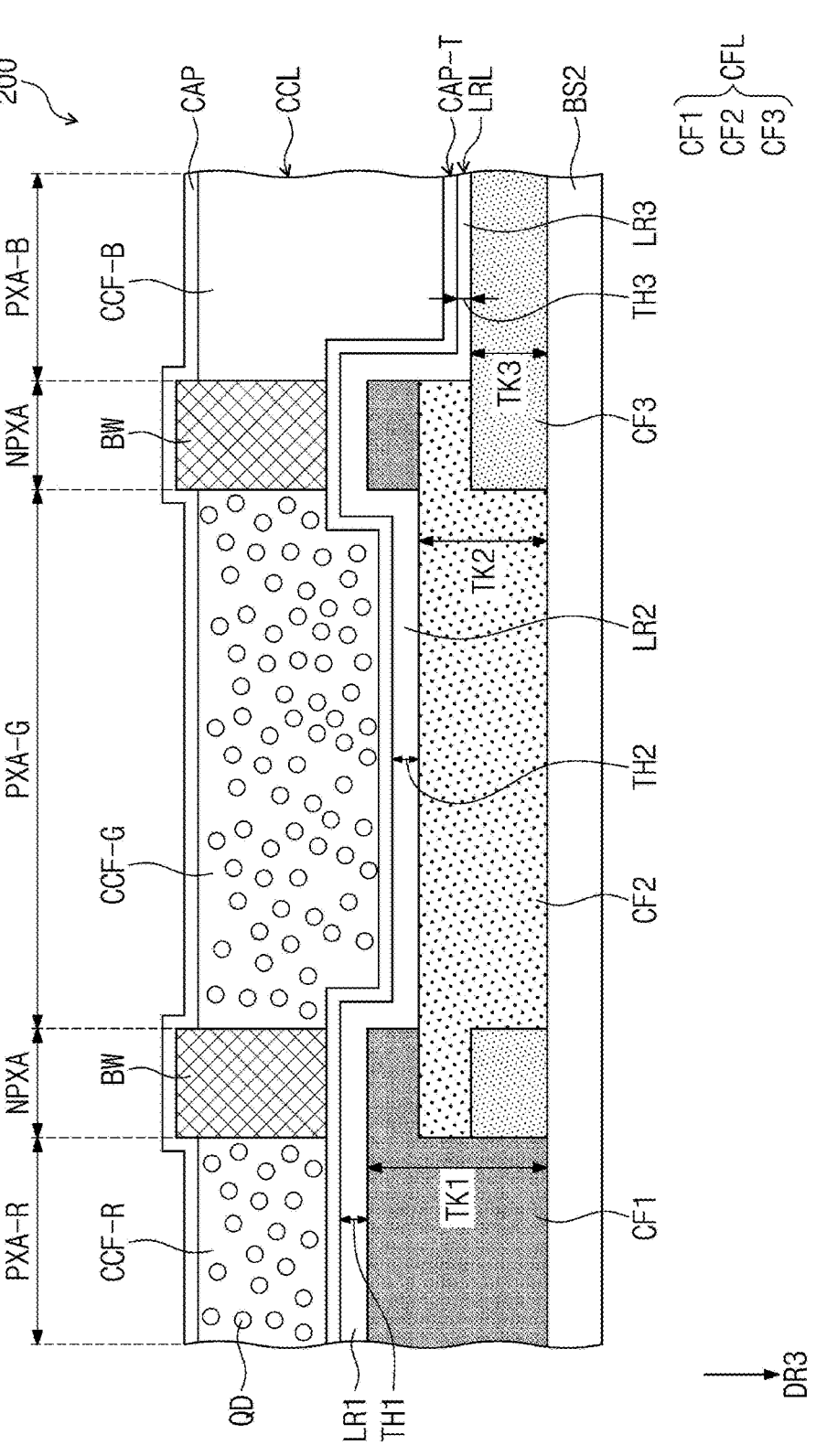
FIG. 7 is a sectional view illustrating a second display substrate according to an embodiment of the present disclosure.

FIG. 7 is a sectional view illustrating a second display substrate according to an embodiment of the present disclosure.

Referring to FIG. 7, a first light control pattern CCF-R and a second light control pattern CCF-G may contain quantum dots QD. A third light control pattern CCF-B may not contain the quantum dots QD (e.g., not contain any quantum dot). To reduce the reflectivity of a color filter layer CFL and raise recycling efficiency, the first and second thicknesses TH1 and TH2 of first and second low refractive index patterns LR1 and LR2 overlapping the first and second light control patterns CCF-R and CCF-G may be determined within the range of about 0.2 μm to about 2.5 μm.

The third thickness TH3 of a third low refractive index pattern LR3 overlapping the third light control pattern CCF-B may be determined to be smaller than the first thickness TH1 and the second thickness TH2. For example, the first thickness TH1 and the second thickness TH2 may range from about 0.4 μm to about 2.5 μm based on light emission efficiency characteristics. At the same time, as the third thickness TH3 is increased, a light output area is decreased, and thus a light exit angle deviation occurs. For example, the third thickness TH3, which is smaller than the first thickness TH1 and the second thickness TH2, may range from about 0.2 μm to about 2.5 μm. The third thickness TH3 may be determined to be smaller than the first thickness TH1 and the second thickness TH2 based on WAD characteristics rather than the recycling efficiency.

Figure 8A:
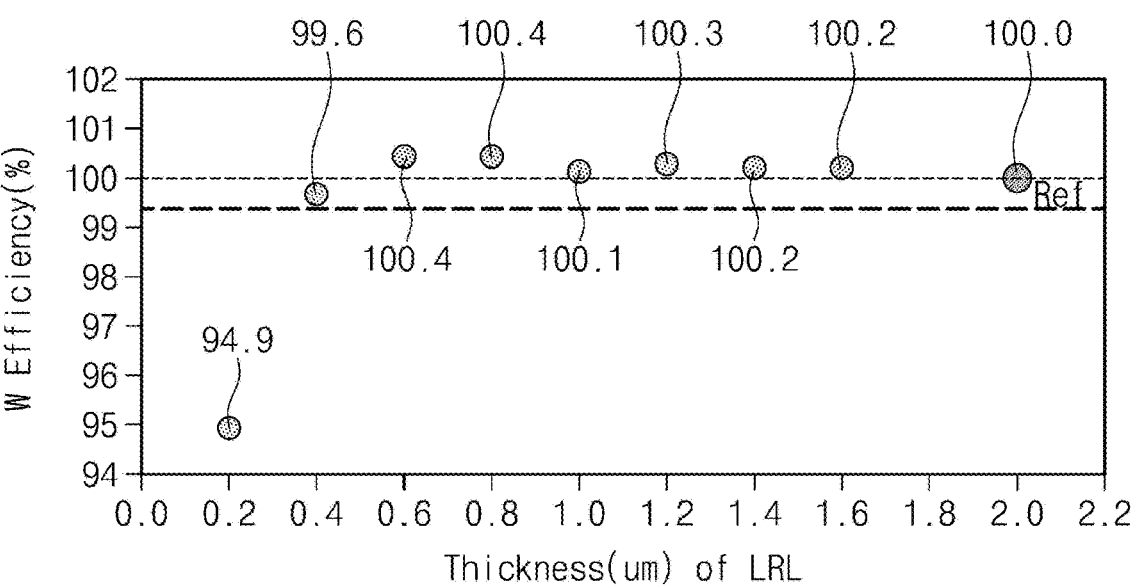
FIGS. 8A and 8B are graphs illustrating effects of the present disclosure.
Figure 8B:
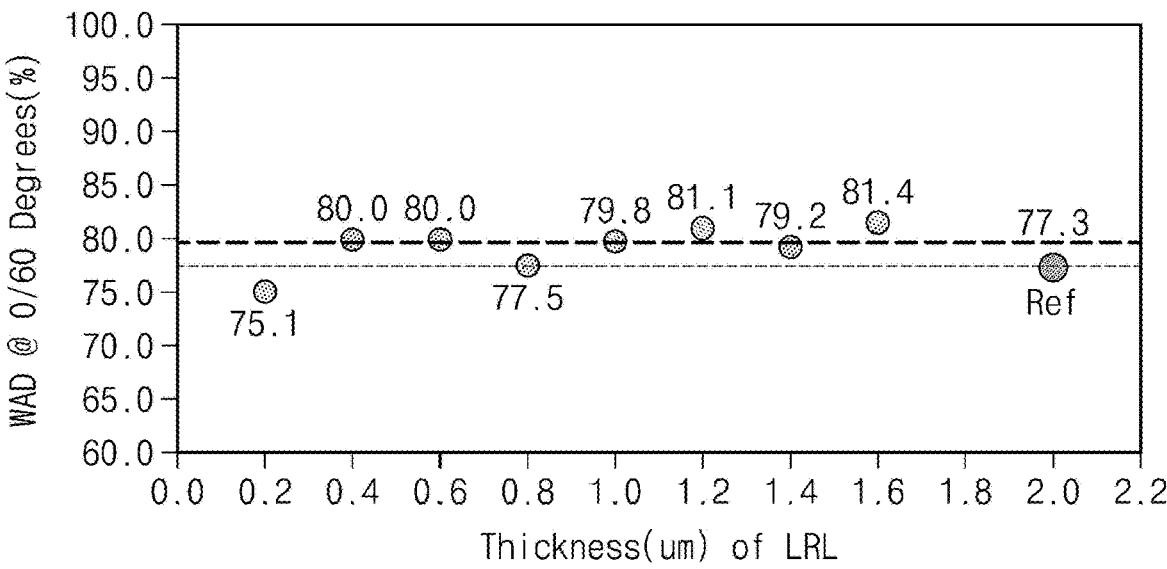

FIGS. 8A and 8B are graphs illustrating effects of the present disclosure.

FIG. 8A is a graph illustrating light efficiency based on white in the thickness range of the low refractive index layer LRL (refer to FIG. 4) from about 0.2 μm to about 2.2 μm. Referring to FIG. 8A, it can be seen that the light efficiency at a thickness of about 2.0 μm is about 100% as a reference (Ref) and almost the same level of efficiency is maintained in the range of about 0.4 μm to about 2.2 μm. In some embodiments, it can be seen that although there is a difference of about 5% in the range of about 0.2 μm to about 0.4 μm, a sufficient level of efficiency is obtained.

FIG. 8B is a graph illustrating WAD characteristics in the thickness range of the low refractive index layer LRL from about 0.2 μm to about 2.2 μm. Referring to FIG. 8B, it can be seen that a level of about 77.3% is obtained as a reference (Ref) at a thickness of about 2.0 μm and a level of about 80% is maintained in the range of about 0.2 μm to about 2.2 μm.

Referring to FIGS. 8A and 8B, it can be seen that the low refractive index layer LRL according to the embodiment of the present disclosure satisfies functional characteristics, such as light recycling and reflectivity reduction, at least in the thickness range of about 0.2 μm to about 2.2 μm.

Figure 9:
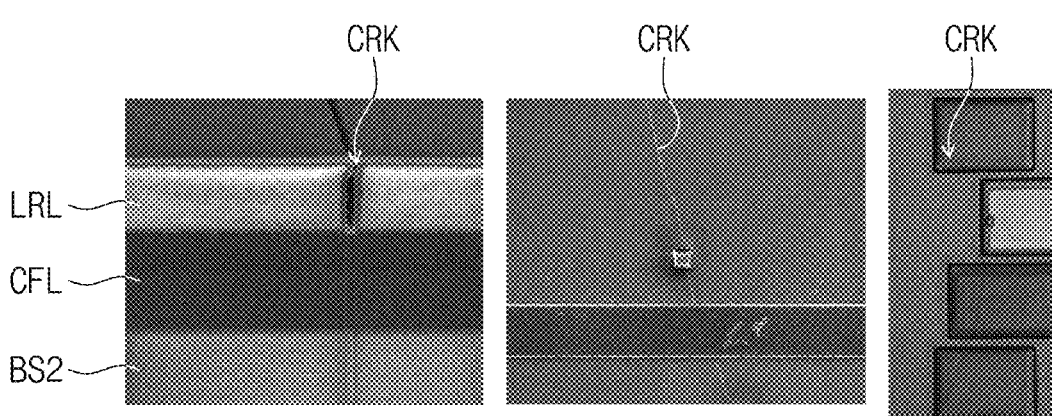
FIG. 9 illustrates photos according to a comparative example.

FIG. 9 illustrates photos according to a comparative example. FIG. 9 shows that the low refractive index layer LRL suffers from cracking when the thickness of the low refractive index layer LRL exceeds the upper thickness limit of about 2.5 μm.

Table 1 shows a simulation result on occurrence or non-occurrence of a crack depending on the thickness of the low refractive index layer LRL and the thickness of the first capping layer CAP-T. FIG. 9 corresponds to photos showing a case in which a crack occurs in Table 1. Referring to Table 1, no crack occurs when the low refractive index layer LRL has a thickness of about 3 μm or less. However, it can be confirmed that when the low refractive index layer LRL has a thickness of about 4 μm, the low refractive index layer LRL suffers from cracking as illustrated in FIG. 9. For example, it can be confirmed that the upper thickness limit satisfying stability in a coating process of the low refractive index layer LRL is up to about 3.0 μm. The upper thickness limit of about 3.0 μm may correspond to the maximum value, and the average upper thickness limit may be about 2.5 μm. For example, the low refractive index layer LRL does not suffer from cracking at the average upper thickness limit of about 2.5 μm regardless of the thickness of the first capping layer CAP-T.

TABLE 1

| Thickness of Low Refractive Index Layer | Thickness of First Capping Layer | Crack |
|---|---|---|
| 1.5 um | 2000 Å | X |
| 1.5 um | 4000 Å | X |
| 1.5 um | 6000 Å | X |
| 2 um | 2000 Å | X |
| 2 um | 4000 Å | X |
| 2 um | 6000 Å | X |
| 3 um | 2000 Å | X |

TABLE 1-continued

| Thickness of Low Refractive Index Layer | Thickness of First Capping Layer | Crack |
|---|---|---|
| 3 um | 4000 Å | X |
| 3 um | 6000 Å | X |
| 4 um | 2000 Å | ○ |
| 4 um | 4000 Å | ○ |
| 4 um | 6000 Å | X |

Accordingly, the thickness of the low refractive index layer LRL according to the embodiment of the present disclosure may be determined in the range from the lower thickness limit of about 0.2 μm that satisfies functional characteristics to the upper thickness limit of about 2.5 μm that satisfies process stability. According to an embodiment, to satisfy the functional characteristics of the low refractive index layer LRL and the process stability, the thicknesses of the first to third low refractive index patterns LR1, LR2, and LR3 in the low refractive index layer LRL may be determined to be different optimal or suitable thicknesses in the range of about 0.2 μm to about 2.5 μm.

Figure 10A:
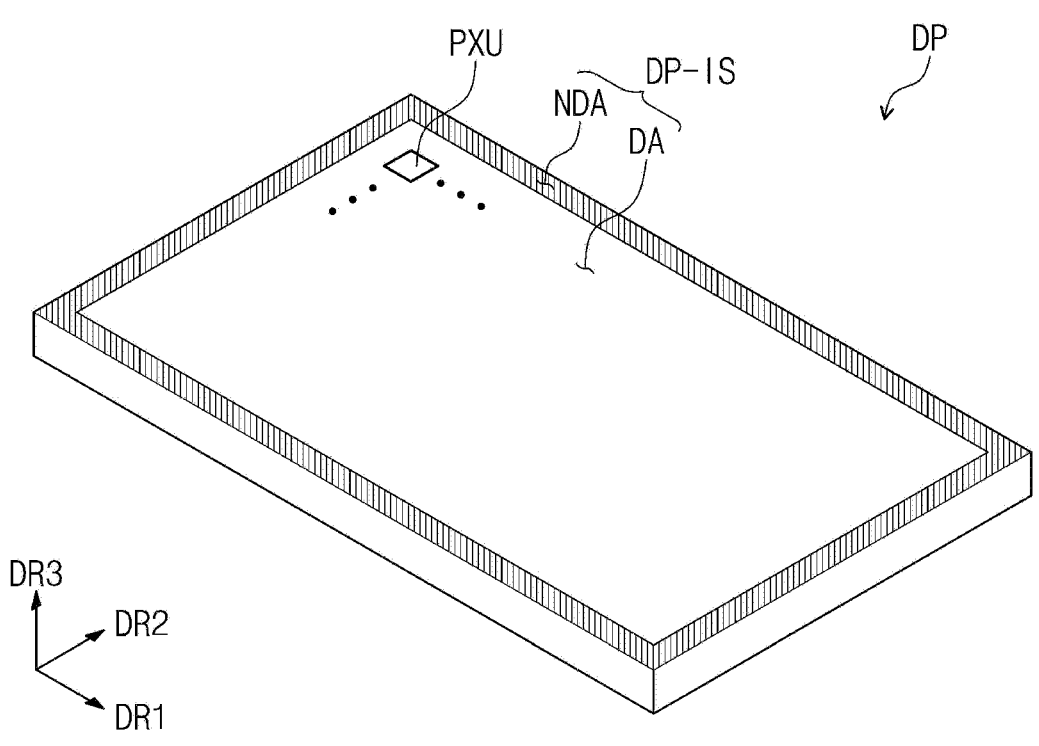
FIGS. 10A and 10B are views illustrating a display panel according to an embodiment of the present disclosure.
Figure 10B:
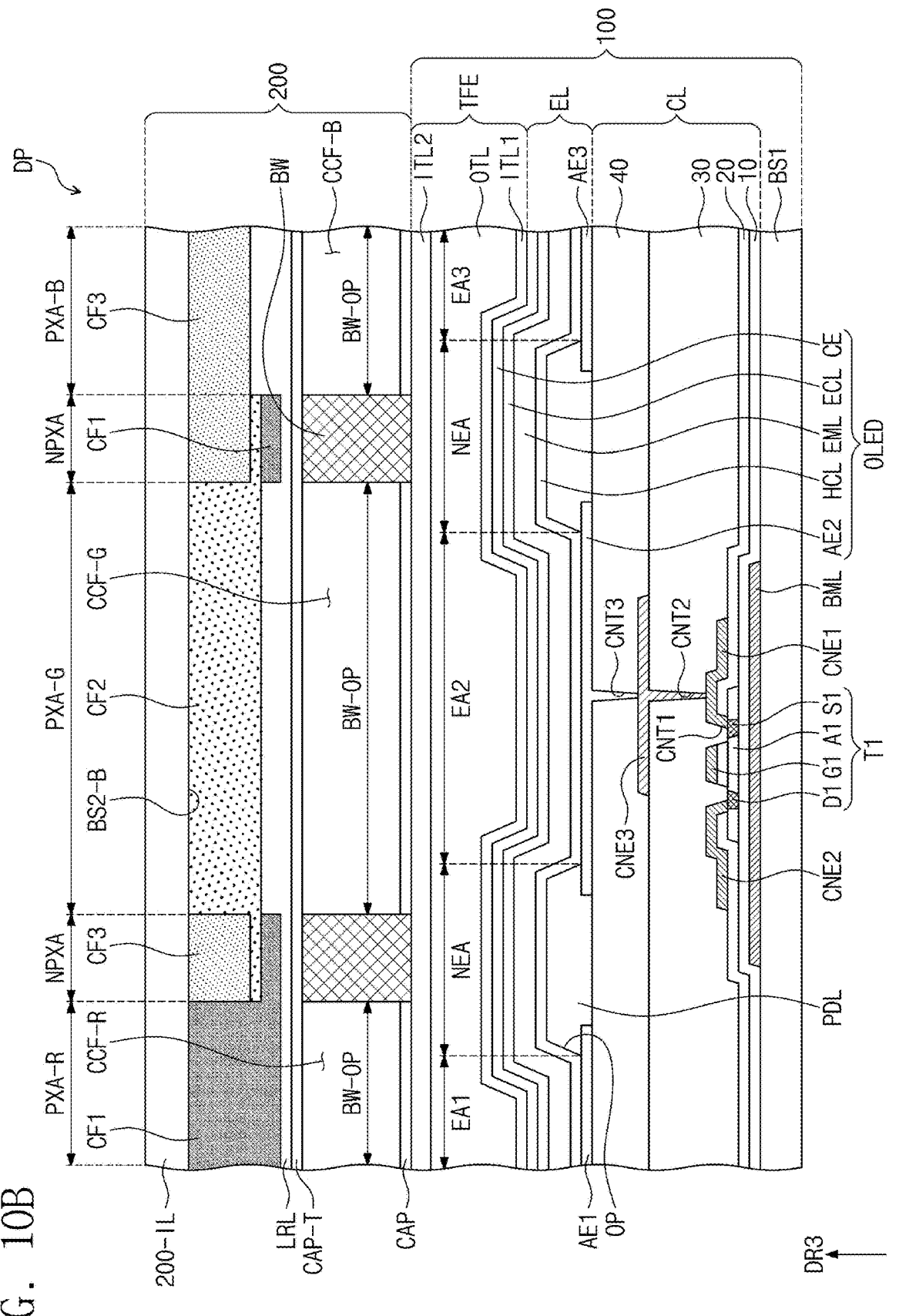

FIG. 10A is a perspective view of a display panel according to an embodiment of the present disclosure. FIG. 10B is a sectional view of the display panel according to an embodiment of the present disclosure.

FIGS. 10A and 10B illustrate the display panel having a structure different from the structure illustrated in FIGS. 1A to 3B.

FIG. 10A is a perspective view of the display panel DP according to an embodiment of the present disclosure. FIG. 10B is a detailed sectional view of a display area DA illustrated in FIG. 10A. Hereinafter, detailed descriptions of components identical to the components described above with reference to FIGS. 1A to 9 will not be provided.

Unlike the display panel DP illustrated in FIGS. 1A to 9, the display panel DP according to this embodiment includes one base layer BS1. In a manufacturing process, a process of combining the first display substrate 100 and the second display substrate 200 is not provided, and structures are sequentially formed on the base layer BS1.

As illustrated in FIGS. 10A and 10B, the display panel DP includes the base layer BS1, and a circuit layer CL, a light emitting element layer EL, and a thin film encapsulation layer TFE that are disposed on the base layer BS1. Detailed descriptions thereabout will not be provided.

A light control layer 200 is disposed on the thin film encapsulation layer TFE. The light control layer 200 corresponds to the second display substrate 200 described above with reference to FIGS. 1A to 9. The second display substrate 200 and the light control layer 200 differ from each other in terms of a manufacturing process. The second display substrate 200 is formed separately from the first display substrate 100, whereas the light control layer 200 may be formed on the thin film encapsulation layer TFE through a substantially continuous process.

The light control layer 200 includes a barrier wall BW, light control patterns CCF-R, CCF-G, and CCF-B, and color filters CF1, CF2, and CF3 that are disposed over the thin film encapsulation layer TFE. Compared with the second display substrate 200, the light control layer 200 is very similar to the second display substrate 200 in terms of the sectional structure and the planar arrangement relationship of the barrier wall BW, the light control patterns CCF-R, CCF-G, and CCF-B, and the color filters CF1, CF2, and CF3.

Furthermore, the light control layer 200 may include a low refractive index layer LRL, a first capping layer CAP-T, and a second capping layer CAP. The characteristics of the low refractive index layer LRL according to the embodiments of the present disclosure described above may each independently be the same as those of the low refractive index layer LRL according to the embodiment illustrated in FIGS. 10A and 10B, and additional description thereabout will not be provided. The second capping layer CAP may be a base layer that provides a flat surface. In an embodiment, the second capping layer CAP may not be provided. In this case, the thin film encapsulation layer TFE may correspond to the base layer. The low refractive index layer LRL and the first capping layer CAP-T may each be an inorganic layer or an organic layer. An additional inorganic layer may be formed between the second capping layer CAP and an insulating layer 200-IL. In an embodiment of the present disclosure, a protective substrate may be additionally disposed on the insulating layer 200-IL. The protective substrate may include a plastic substrate or a glass substrate.

According to the embodiments of the present disclosure, the display efficiency of the display panel may be improved by setting the thickness of the low refractive index layer to the optimal or suitable range.

According to the embodiments of the present disclosure, the low refractive index layer may have different thicknesses within the optimal or suitable range depending on the pixel areas, and thus the display efficiency of the display panel may be improved.

As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, expressions such as "at least one of a, b or c", "at least one selected from among a, b and c", "at least one selected from the group consisting of a, b and c", etc., may indicate only a, only b, only c, both (e.g., simultaneously) a and b, both (e.g., simultaneously) a and c, both (e.g., simultaneously) b and c, all of a, b, and c, or variations thereof.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

It will be understood that when an element or layer is referred to as being "on", "connected to", "coupled to", or "adjacent to" another element or layer, it can be directly on, connected to, coupled to, or adjacent to the other element or layer, or one or more intervening elements or layers may be present. In contrast, when an element or layer is referred to as being "directly on," "directly connected to", "directly coupled to", or "immediately adjacent to" another element or layer, there are no intervening elements or layers present.

As used herein, the term "substantially," "about," and similar terms are used as terms of approximation and not as terms of degree, and are intended to account for the inherent deviations in measured or calculated values that would be recognized by those of ordinary skill in the art. "About" or "substantially", as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" or "substantially" may mean within one or more standard deviations, or within ±30%, 20%, 10%, 5% of the stated value.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The display device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the device may be formed on one integrated circuit (IC) chip or on separate IC chips. Further, the various components of the [device] may be implemented on a flexible printed circuit film, a tape carrier package (TCP), a printed circuit board (PCB), or formed on one substrate. Further, the various components of the device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While the present disclosure has been described with reference to embodiments thereof, it will be apparent to those of ordinary skill in the art that one or more suitable changes and modifications may be made thereto without departing from the spirit and scope of the present disclosure as set forth in the following claims and equivalents thereof.

What is claimed is:

1. A display panel comprising:
a light emitting element layer comprising a light emitting element configured to generate a first color light;
a light control layer over the light emitting element layer, the light control layer comprising a quantum dot;
a color filter layer over the light control layer; and
a refractive index layer, having refractive index of at most about 1.4, between the light control layer and the color filter layer, the refractive index layer having a thickness of about 0.2 μm to about 2.5 μm.

2. The display panel of claim 1, wherein the refractive index layer has a thickness of about 0.4 μm to about 2.5 μm.

3. The display panel of claim 1, wherein the light control layer comprises a first light control pattern configured to convert the first color light into a second color light, a second light control pattern configured to convert the first color light into a third color light, and a third light control pattern configured to transmit the first color light, and
wherein the first light control pattern and the second light control pattern comprise the quantum dot.

4. The display panel of claim 3, wherein the color filter layer comprises a first color filter corresponding to the first light control pattern, a second color filter corresponding to the second light control pattern, and a third color filter corresponding to the third light control pattern, and
wherein the refractive index layer comprises a first refractive index pattern corresponding to the first color filter, a second refractive index pattern corresponding to the second color filter, and a third refractive index pattern corresponding to the third color filter.

5. The display panel of claim 4, wherein the first refractive index pattern, the second refractive index pattern, and the third refractive index pattern have different thicknesses.

6. The display panel of claim 5, wherein the first color filter, the second color filter, and the third color filter have different thicknesses.

7. The display panel of claim 6, wherein thicknesses of the first refractive index pattern, the second refractive index pattern, and the third refractive index pattern are inversely proportional to thicknesses of the first color filter, the second color filter, and the third color filter respectively.

8. The display panel of claim 5, wherein the first light control pattern is on a first pixel area, the second light control pattern is on a second pixel area, and the third light control pattern is on a third pixel area, and
wherein the first pixel area, the second pixel area, and the third pixel area have different areas in a plan view.

9. The display panel of claim 8, wherein thicknesses of the first refractive index pattern, the second refractive index pattern, and the third refractive index pattern are inversely proportional to areas of the first pixel area, the second pixel area, and the third pixel area respectively.

10. The display panel of claim 3, wherein the refractive index layer comprises a first refractive index pattern corresponding to the first light control pattern, a second refractive index pattern corresponding to the second light control pattern, and a third refractive index pattern corresponding to the third light control pattern, and
wherein the third refractive index pattern has a smaller thickness than each of the first refractive index pattern and the second refractive index pattern.

11. The display panel of claim 1, further comprising:

a capping layer between the light control layer and the refractive index layer and configured to provide a planar surface to the light control layer.

12. A display panel comprising:

a light emitting element layer comprising a light emitting element configured to emit a first color light;

a light control layer over the light emitting element layer;

a color filter layer over the light control layer, the color filter layer comprising a first color filter, a second color filter, and a third color filter having different thicknesses; and a refractive index layer, having a refractive index of at most about 1.4, between the light control layer and the color filter layer in a thickness direction, the refractive index layer comprising a first refractive index pattern corresponding to the first color filter, a second refractive index pattern corresponding to the second color filter, and a third refractive index pattern corresponding to the third color filter, wherein the first refractive index pattern, the second refractive index pattern, and the third refractive index pattern have different thicknesses.

13. The display panel of claim 12, wherein the light control layer comprises a first light control pattern, a second light control pattern, and a third light control pattern, and wherein the first light control pattern corresponds to the first refractive index pattern, the second light control pattern corresponds to the second refractive index pattern, and the third light control pattern corresponds to the third refractive index pattern.

14. The display panel of claim 13, wherein at least one light control pattern selected from among the first light control pattern, the second light control pattern, and the third light control pattern comprises a quantum dot, and remaining light control pattern(s) do not comprise any quantum dot.

15. The display panel of claim 14, wherein the at least one light control pattern comprising the quantum dot has a thickness of about 0.4 μm or more.

16. The display panel of claim 14, wherein each remaining light control pattern not comprising any quantum dot have a smaller thickness than the at least one light control pattern comprising the quantum dot.

17. The display panel of claim 13, wherein the first light control pattern is on a first pixel area, the second light control pattern is on a second pixel area, and the third light control pattern is on a third pixel area, and wherein areas of the first pixel area, the second pixel area, and the third pixel area are inversely proportional to thicknesses of the first refractive index pattern, the second refractive index pattern, and the third refractive index pattern corresponding to the first pixel area, the second pixel area, and the third pixel area respectively.

18. The display panel of claim 12, wherein thicknesses of the first color filter, the second color filter, and the third color filter are inversely proportional to thicknesses of the first refractive index pattern, the second refractive index pattern, and the third refractive index pattern respectively.

19. The display panel of claim 12, further comprising:

a capping layer between the light control layer and the refractive index layer and configured to cover the refractive index layer and the capping layer comprising an inorganic material.

20. A display panel comprising:

a light emitting element layer comprising a light emitting element configured to emit a first color light;

a light control layer over the light emitting element layer;

a color filter layer over the light control layer, the color filter layer comprising a first color filter, a second color filter, and a third color filter having different thicknesses; and a refractive index layer, having a refractive index of at most about 1.4, between the light control layer and the color filter layer, the refractive index layer comprising a first refractive index pattern corresponding to the first color filter, a second refractive index pattern corresponding to the second color filter, and a third refractive index pattern corresponding to the third color filter, wherein the first refractive index pattern, the second refractive index pattern, and the third refractive index pattern have different thicknesses, wherein the first refractive index pattern, the second refractive index pattern, and the third refractive index pattern of the refractive index layer each has a thickness of about 0.2 μm to about 2.5 μm.

* * * * *